United States Patent
So et al.

(10) Patent No.: US 11,068,022 B2
(45) Date of Patent: Jul. 20, 2021

(54) DISPLAY STAND AND DISPLAY DEVICE COMPRISING SAME

(71) Applicant: SAMSUNG ELECTRONICS CO., LTD., Suwon-si (KR)

(72) Inventors: Kwang-hyuck So, Seongnam-si (KR); Tae-yeon Won, Yongin-si (KR); Jae-wook Yoo, Seoul (KR); Seung-ho Lee, Guri-si (KR); Yong-joo Lee, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 232 days.

(21) Appl. No.: 16/084,382

(22) PCT Filed: Dec. 26, 2017

(86) PCT No.: PCT/KR2017/015423
§ 371 (c)(1),
(2) Date: Sep. 12, 2018

(87) PCT Pub. No.: WO2018/117772
PCT Pub. Date: Jun. 28, 2018

(65) Prior Publication Data
US 2020/0174515 A1  Jun. 4, 2020

Related U.S. Application Data

(60) Provisional application No. 62/439,211, filed on Dec. 27, 2016, provisional application No. 62/438,775, filed on Dec. 23, 2016.

(30) Foreign Application Priority Data

Feb. 24, 2017  (KR) .......................... 10-2017-0024661

(51) Int. Cl.
*G06F 1/16* (2006.01)
*F16M 11/22* (2006.01)
(Continued)

(52) U.S. Cl.
CPC ........... *G06F 1/1601* (2013.01); *F16M 11/22* (2013.01); *H05K 7/12* (2013.01); *H05K 7/1401* (2013.01); *H05K 7/1438* (2013.01)

(58) Field of Classification Search
CPC .... G06F 1/1601; G06F 1/1605; G06F 1/1637; G06F 2200/1612; G06F 1/166;
(Continued)

(56) References Cited

U.S. PATENT DOCUMENTS 5,947,440 A * 9/1999 Cho ........................ F16M 11/10
361/679.22
5,978,211 A * 11/1999 Hong ..................... F16M 11/10
361/679.23
(Continued)

FOREIGN PATENT DOCUMENTS

EP      1 785 660 A2    5/2007
EP      3078896         10/2016
(Continued)

OTHER PUBLICATIONS

Communication pursuant to Article 94(3) EPC dated Mar. 26, 2020, in corresponding European Patent Application No. 17885145.7.
(Continued)

*Primary Examiner* — Mandeep S Buttar
(74) *Attorney, Agent, or Firm* — Staas & Halsey LLP

(57) ABSTRACT

A display stand and a display device comprising the same are disclosed. The disclosed display device may comprise: a display body including a display panel and having a mounting groove formed on the rear surface thereof; a stand which is detachably mounted to the mounting groove and conceals
(Continued)

a cable connected to the display body; and a display body cover which is detachably coupled to the display body so as to cover the mounting groove and through which a part of the stand passes.

5 Claims, 28 Drawing Sheets

(51) Int. Cl.
  *H05K 7/12* (2006.01)
  *H05K 7/14* (2006.01)
(58) Field of Classification Search
  CPC ..... G06F 1/1654; G06F 1/1607; F16M 11/10; F16M 2200/08; F16M 11/041; F16M 11/24; F16M 11/04; H05K 5/0017; H05K 5/0234; H05K 5/0204
  USPC .... 248/917, 918, 919, 923, 121, 136, 176.1, 248/346.01; 361/679.01, 679.06, 679.21, 361/679.22, 679.59, 809
  See application file for complete search history.

(56) References Cited

U.S. PATENT DOCUMENTS

| | | | |
|---|---|---|---|
| 6,010,111 A * | 1/2000 | Cho | F16M 11/10 248/346.06 |
| 7,126,815 B2 | 10/2006 | Hwang et al. | |
| 7,237,755 B2 | 7/2007 | Cho et al. | |
| 7,819,368 B2 | 10/2010 | Jung et al. | |
| 8,498,101 B2 | 7/2013 | Chiang et al. | |
| 9,077,940 B2 | 7/2015 | Choi et al. | |
| 9,836,080 B2 | 12/2017 | Park et al. | |
| 2004/0047115 A1 | 3/2004 | Helot et al. | |
| 2005/0201046 A1* | 9/2005 | Hwang | G06F 1/1601 361/679.06 |
| 2006/0214072 A1 | 9/2006 | Lee | |
| 2007/0007401 A1 | 1/2007 | Corporation et al. | |
| 2009/0153770 A1* | 6/2009 | Martin | H02G 3/32 349/58 |
| 2011/0069055 A1 | 3/2011 | Jung et al. | |
| 2011/0116218 A1 | 5/2011 | Choi et al. | |
| 2012/0268449 A1 | 10/2012 | Choi et al. | |
| 2014/0240200 A1* | 8/2014 | Khor | F16M 11/00 345/1.3 |
| 2015/0163935 A1 | 6/2015 | Kasuga | |
| 2015/0289390 A1 | 10/2015 | Choi et al. | |
| 2016/0296018 A1 | 10/2016 | Ahn et al. | |
| 2016/0353593 A1 | 12/2016 | Park et al. | |

FOREIGN PATENT DOCUMENTS

| | | |
|---|---|---|
| EP | 3098644 | 11/2016 |
| KR | 10-2005-0091508 | 9/2005 |
| KR | 10-2006-0008537 | 1/2006 |
| KR | 10-0969136 | 7/2010 |
| KR | 10-2011-0049206 | 5/2011 |
| KR | 10-2011-0055345 A | 5/2011 |
| KR | 10-1361297 | 2/2014 |
| KR | 10-2016-0120429 A | 10/2016 |
| KR | 10-2016-0139832 A | 12/2016 |
| WO | WO 2007/086002 A1 | 8/2007 |

OTHER PUBLICATIONS

International Search Report, PCT/ISA/210, dated Apr. 19, 2018, in corresponding International Patent Application No. PCT/KR2017/015423.
International Written Opinion, PCT/ISA/237, dated Apr. 19, 2018, in corresponding International Patent Application No. PCT/KR2017/015423.
European Search Report dated Jan. 7, 2019, in corresponding European Patent Application No. 17885145.7.
European Office Action dated Jul. 12, 2019 in corresponding European Patent Application No. 17885145.7.
European Communication dated Oct. 14, 2020 in European Patent Application No. 17885145.7.
Indian Office Action dated Nov. 27, 2020 in Indian Patent Application No. 201817034907.
Korean Office Action dated Dec. 23, 2020 in Korean Patent Application No. 10-2017-0024661.
European Communication dated Apr. 21, 2021 in European Patent Application No. 17885145.7.

* cited by examiner

DISPLAY STAND AND DISPLAY DEVICE COMPRISING SAME

CROSS-REFERENCE TO RELATED APPLICATION

This application is a U.S. National Stage Application which claims the benefit under 35 U.S.C. § 371 of PCT International Patent Application No. PCT/KR2017/015423, filed Dec. 26, 2017, which claims the benefit of U.S. Provisional Application No. 62/438,775 filed Dec. 23, 2016, and U.S. Provisional Application No. 62/439,211 filed Dec. 27, 2016, and claims foreign priority benefit under 35 U.S.C. § 119 of Korean Patent Application No. 10-2017-0024661 filed Feb. 24, 2017, the contents of which are incorporated herein by reference.

FIELD OF THE INVENTION

Devices and methods consistent with what is disclosed herein relate to a display stand and a display apparatus including the same, and more particularly, to a display stand for concealing a cable connected to a display body when viewed from an outside and a display apparatus including the same.

DESCRIPTION OF THE RELATED ART

A display apparatus could be embodied as a TV, a monitor, of the like and includes a display body having a display panel, and a stand for supporting the display body.

A power cable for supplying power, and a cable for receiving various signals such as image signals, antenna signals, etc. may be connected to the display body from an outside. In this case, the cables may be disposed while being exposed in the rear of the display body, and thus not only may damage the appearance of a display apparatus, but also may disturb viewing experience of a user for being easily perceived by the user who watches a screen of the display apparatus.

When a display apparatus is a wall-mounted type, a structural configuration for fixing a display apparatus on a wall may protrude from the wall with a significant length, and it is not compactly formed in terms of structure. Accordingly, a display apparatus may protrude from the wall further enough to occupy a large space, and give an unstable and unnatural feeling to a user.

SUMMARY

A cable connected to a display body is disposed while being exposed on the back of the display body. Thus, the appearance of a display apparatus is damaged, and a viewing experience of a user who watches a screen of the display apparatus is disturbed.

One technical task of the present disclosure is to diversify the design of a display apparatus by making a single stand mounting structure formed in a display body compatible with various designs of stands, and to provide a display apparatus with a simple appearance that can be kept by organizing and concealing cables through a cable.

Another technical task of the present disclosure is to provide a display apparatus that gives a stable feeling since a display body is in close contact with a wall as if a frame is hung on the wall by using a wall mount unit.

According to an exemplary embodiment, there is provided a display apparatus, including a display body including a display panel, and a mounting groove formed on a rear surface thereof, a stand configured to be detachably mounted on the mounting groove and to conceal a cable connected to the display body, and a display body cover configured to be detachably coupled to the display body to cover the mounting groove, through which a part of the stand passes.

The display body cover may be detachably snap-coupled to the display body.

The display body cover may be locking-coupled to the display body to enable one-touch unlocking. The display body cover may include a plurality of locking protrusions which are locked to a plurality of push latches disposed in the mounting groove at predetermined intervals.

The cable may be split into two sides in the mounting groove and electrically connected to the display body.

The stand may include a groove-shaped guide part into which the cable is inserted, and a stand cover for covering the guide part.

The stand may include a path-shaped guide part for guiding the cable to pass through the stand, the path-shaped guide part being downwardly formed toward a bottom of the stand from one surface of the stand.

The guide part may include a first opening disposed closest to one portion of the display apparatus from which the cable is drawn, and a second opening formed at a lower end of the stand.

According to an exemplary embodiment, there is provided a display apparatus including a display body including a display panel, and a mounting groove formed on a rear surface thereof, a stand configured to be detachably mounted on the mounting groove and to fix a cable connected to the display body in a concealable state, and a wall mount unit configured to be detachably coupled to the mounting groove, wherein a thickness thereof is smaller than or equal to a depth of the mounting groove.

The wall mount unit may include a bracket fixed onto the mounting groove, and a first link of which one end is hinge-connected to the bracket, and the other end has a hanging bar, and a second link of which both sides are respectively hinge-coupled to the first link and the bracket, wherein the hanging bar is detachably hung on a fixing member mounted on a wall.

According to an exemplary embodiment, there is provided a stand including a mounting member detachably mounted on a rear surface of a display apparatus, a support connected to the mounting member, and a base connected to a lower end of the support and including a guide groove for fixing a cable connected to the display apparatus, wherein the guide groove includes a first opening disposed closest to one portion of the display apparatus from which the cable is drawn, and a second opening formed at a lower end of the support.

The first opening may be formed at an upper end of the support or formed downwardly spaced apart from the upper end of the support.

A fixing protrusion for preventing deviation of the cable may be formed in the guide groove.

The stand may further include a stand cover detachably coupled to the support to cover the guide groove.

The support may include a first portion connected to the mounting member, and a second portion extending from the first portion and rearwardly bent from the first portion.

The base may include a pair of stick members linearly extending from both sides of a lower end of the second portion and symmetrically disposed, or may be formed in a disc shape where the lower end of the second portion is combined.

The mounting member may include an engagement protrusion inserted into an engagement hole formed on a rear surface of the display apparatus, and be coupled to the rear surface of the display apparatus by a plurality of screws.

The mounting member may include engagement protrusions snap-coupled to a plurality of fixing units formed on the rear surface of the display apparatus.

According to an exemplary embodiment, there is provided a stand including a mounting member detachably mounted on a rear surface of a display apparatus, a support connected to the mounting member, and a base connected to a lower end of the support and including a guide groove for fixing a cable connected to the display apparatus, wherein the guide groove includes a first opening disposed closest to one portion of the display apparatus from which the cable is drawn, and a second opening formed at a lower end of the support.

The base may have a conical shape, through which the guide groove passes.

The first opening may be formed on a circumferential surface of the support, and the second opening may be formed on a bottom of the support.

The stand may be rotatably coupled to an upper end of the base.

The base may include a frame coupled to a lower end of the support, and a plurality of bridges connected to the frame, wherein the plurality of bridges are disposed in different directions to distribute a load of the display apparatus.

The guide groove may extend in a length direction of one of the frame or the plurality of bridges.

The stand may further include a stand cover detachably coupled to the plurality of bridges to cover a cable fixed onto the guide groove.

A fixing protrusion for preventing deviation of the cable may be formed in the guide groove.

DETAILED DESCRIPTION OF EXEMPLARY EMBODIMENTS

Figure 1:
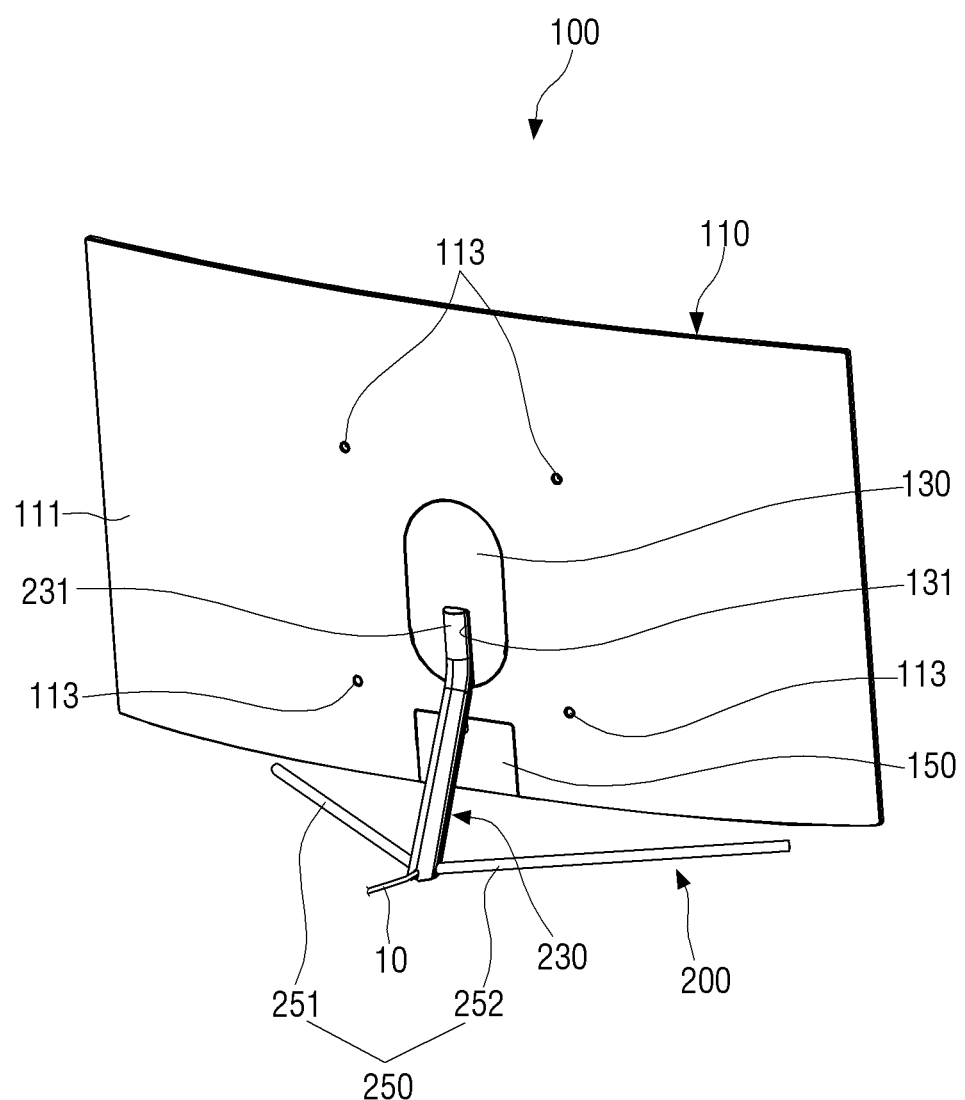
FIG. 1 is a perspective view illustrating a display apparatus according to an embodiment of the present disclosure.

In order to fully understand the structure and effects of the disclosure, preferable embodiments of the disclosure will be described with reference to the accompanying drawings. The disclosure may, however, be embodied in many different forms and should not be construed as limited to the embodiments set forth herein. It should be understood, however, that the description of the embodiments is provided to enable the disclosure of the disclosure to be complete, and will fully convey the scope of the disclosure to a person having ordinary skill in the art to which the disclosure belongs. In the accompanying drawings, the constituent elements are enlarged in size for convenience of explanation and the proportions of the constituent elements can be exaggerated or reduced.

The terms such as "first," "second," and so on may be used to describe a variety of elements, but the elements should not be limited by these terms. The terms are used simply to distinguish one element from other elements. The use of such ordinal numbers should not be construed as limiting the meaning of the term. For example, without departing from the scope of the disclosure, the first component may be referred to as a second component, and similarly, the second component may also be referred to as a first component.

The singular expression also includes the plural meaning as long as it does not differently mean in the context. In this specification, terms such as 'include' and 'have/has' should be construed as designating that there are such characteristics, numbers, operations, elements, components or a combination thereof in the specification, not to exclude the existence or possibility of adding one or more of other characteristics, numbers, operations, elements, components or a combination thereof.

Unless otherwise defined, all terms (including technical and scientific terms) used herein have the same meaning as commonly understood by one of ordinary skill in the art to which this disclosure belongs.

A display apparatus according to an embodiment of the present disclosure may be compatible with stand designed in various types through a single stand mounting structure formed in a display body thereby to produce various designs of a display apparatus.

A display apparatus according to an embodiment includes a stand for concealing a power source cable connected to a display apparatus and various signal cables, and therefore, cables are well organized and the outside of the display apparatus could kept organized.

A display apparatus according to an embodiment of the present disclosure may be used by hanging on a wall through a wall mount unit. In this case, the wall mount unit is mounted while being inserted into a mounting groove formed on the rear surface of the display apparatus. A depth of the mounting groove may be equal to or greater than a thickness of a wall mount unit, and thus the wall mount unit may not protrude further than a rear surface of the display apparatus. Therefore, when a display apparatus is hung on a wall through a wall mount unit, a rear surface of a display apparatus is very close to a wall, or touch the wall. Therefore, a display apparatus is provided as if a frame is hung on a wall unlike a conventional display apparatus.

A display body of a display apparatus according to various embodiments of the present disclosure could be a television or a monitor.

Hereinafter, embodiments of the present disclosure will be described with reference to drawings.

Figure 2:
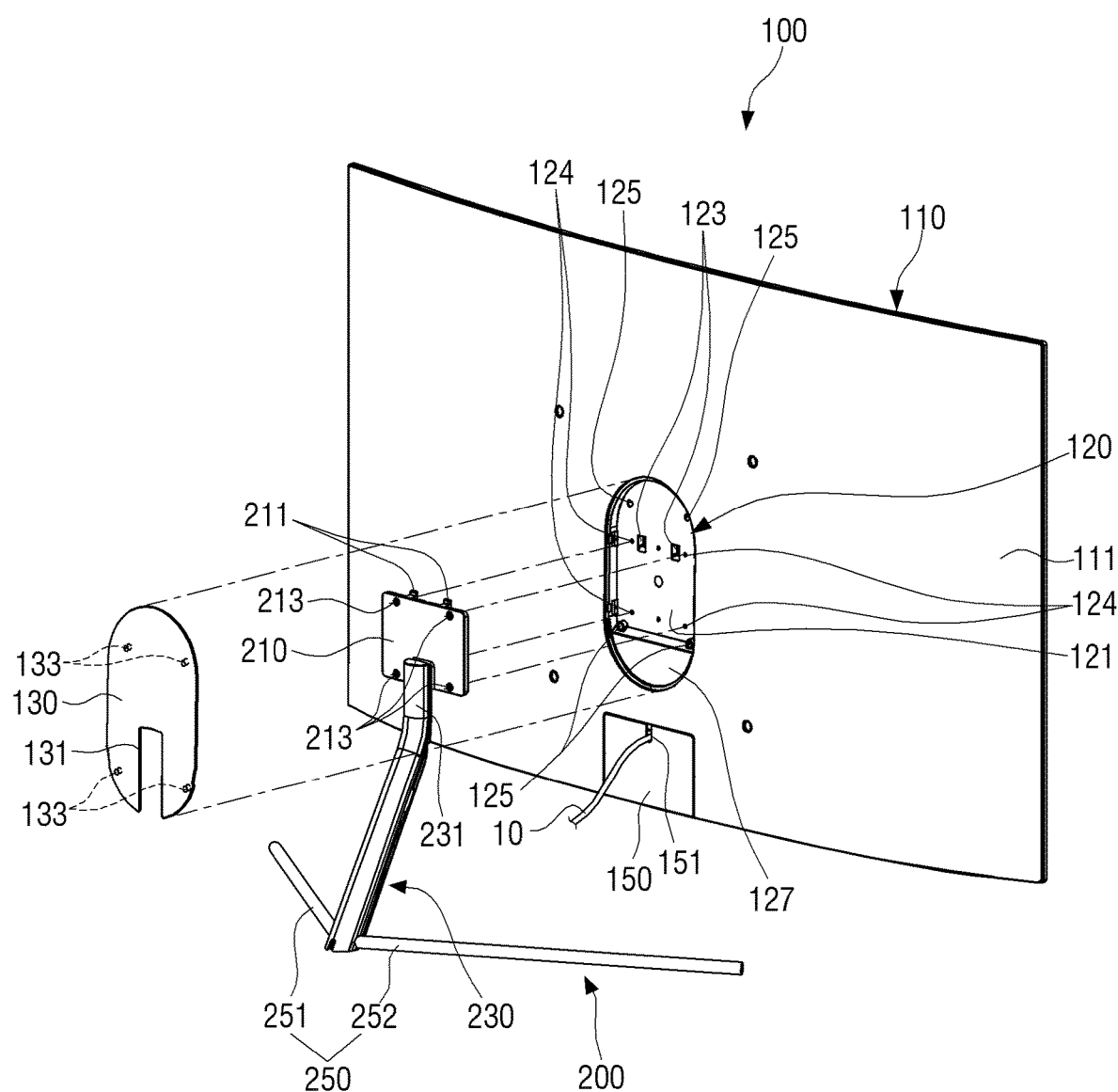
FIG. 2 is an exploded perspective view illustrating a display body, a stand and a display body cover of the display apparatus shown in FIG. 1.
Figure 3:
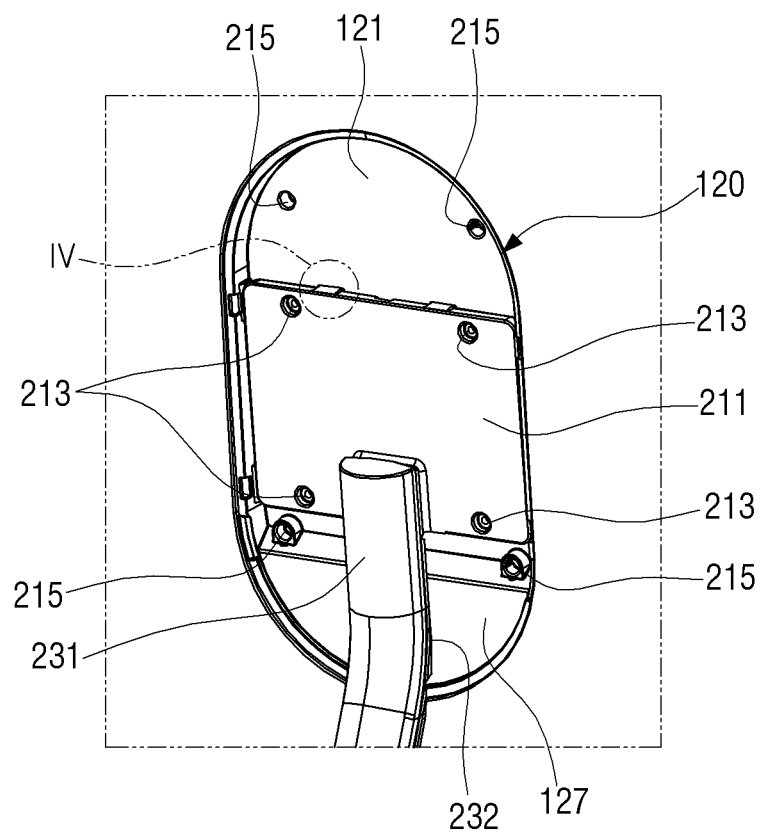
FIG. 3 is a perspective view illustrating that a mounting member of a stand is mounted on a mounting groove of the display body.
Figure 4:
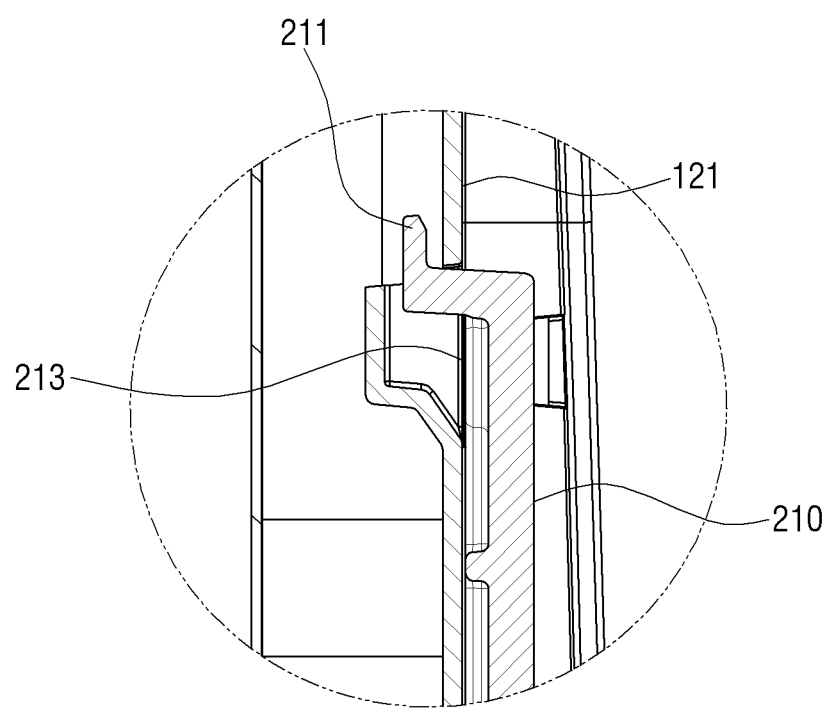
FIG. 4 is a cross-sectional view illustrating section IV shown in FIG. 3, and illustrates that a locking protrusion is inserted into an engagement hole of a mounting groove.
Figure 5:
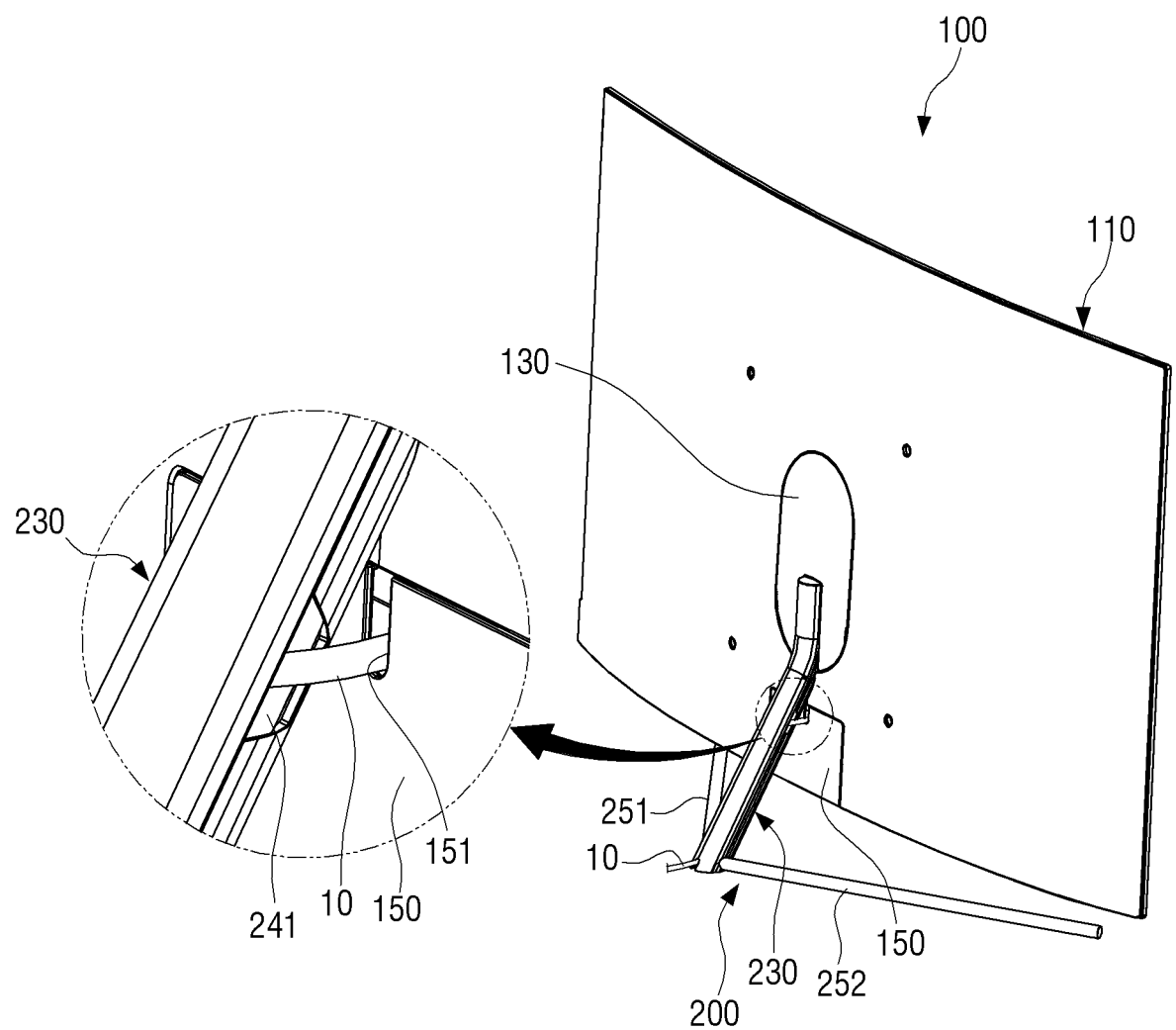
FIG. 5 is a perspective view illustrating the degree of exposure of a cable between a display body and a stand.

FIG. 1 is a perspective view illustrating a display apparatus according to an embodiment of the present disclosure, FIG. 2 is an exploded perspective view of a display apparatus, FIG. 3 is a perspective view illustrating that a mounting member of a stand is mounted on a mounting groove of the display body, FIG. 4 is a cross-sectional illustrating that a locking protrusion of a mounting member is inserted into an engagement hole of a mounting groove, and FIG. 5 is a perspective view illustrating the degree of exposure of a cable between a display body and a stand.

Referring to FIG. 1, a display apparatus according to an embodiment of the present disclosure may be a TV or a monitor.

A display apparatus 100 according to an embodiment of the present disclosure may include a display body 110 having a display panel in front of the display apparatus, and a stand 200 detachably coupled to a rear surface 111 of the display body 110 to support the display body 110.

Referring to FIG. 2, the display body 110 may have a flat shape or a curved shape, and a curve shaped display body will be exemplified in this embodiment.

A plurality of heat dissipating grooves (not shown) for discharging heat generated from the inside of the display body 110 may be provided on the rear surface 111 having a predetermined curvature of the display body 110. The display body 110 may include a plurality of VESA holes 113 according to Video Electronics Standards Association (VESA) standard on the rear surface 111 thereof.

The display body 110 may include a mounting groove 120 detachably mounted while a mounting member 210 of the stand 200 is inserted into the rear surface 111. The mounting groove 120 may include a first bottom surface 121, and a second bottom surface 127, which is stepped higher than the first bottom surface 121.

A plurality of locking holes 123 detachably coupled to a plurality of locking protrusions 211 formed in the mounting member 210 of the stand 200 may be formed on the first bottom surface 121. Referring to FIG. 4, when the plurality of locking protrusions 211 of the mounting member 210 are inserted into the plurality of locking holes 123 in order to mount the mounting member 210 on the mounting groove 120, the plurality of locking protrusions 211 may be disposed behind the first bottom surface 211 of the mounting groove 211. Therefore, when the mounting member 210 is pulled in the direction opposite to the mounting direction, the plurality of locking protrusions 211 may be interfered by the rear surface of the first bottom surface 211, so that deviation may not easily occur.

A plurality of engagement holes 125 engaged with a plurality of screws (not shown) for fixing the mounting member 210 onto a first bottom surface may be formed. In addition, the first bottom surface 121 may include a plurality of engagement holes 125 detachably coupled to a plurality of engagement protrusions 133 of a display body cover 130.

Referring to FIG. 3, when the mounting member 210 of the stand is mounted on the mounting groove 120, the second bottom surface 127 may be supported by a first portion 231 of the support 230 constituting the stand. To be specific, one surface 232 of the first portion 231 may be closely attached to the second bottom surface 127.

Accordingly, the stand 200 may be mounted on the mounting groove 120 with a maximum contact area. Thus, the stand 200 may be firmly coupled to the display body 110.

The display body cover 130 may be detachably coupled to the display body 110 to cover the mounting groove 120 so that the inside of the mounting groove 120 may not be exposed to the outside. To be specific, an outline of the display body cover 130 may be formed to correspond to that of the mounting groove 120. The display body cover 130 may include a plurality of engagement protrusions 133 on a surface opposite to the mounting groove 120. An outer surface of each of the plurality of engagement protrusions 133 may be covered by a cap (not shown) made of rubber or coated by a rubber film (not shown) so that the plurality of engagement protrusions 133 may be coupled to the plurality of engagement holes 125 formed on the first bottom surface 121 in pressure.

When the display body cover 130 covers the mounting groove 120, as shown in FIG. 1, a penetration hole 131 through which a first portion 231 of a support 230 passes may be formed. The penetration hole 131 may be formed in a shape corresponding to the outline of the first portion 231 to remove interference with the first portion 231 of the support 230 when the mounting groove 120 is covered with the display body cover 130. According to an embodiment, the penetration hole 131 may be linearly formed since the first position 231 is linearly formed. However, when the outline of the first portion 231 is formed in a curved line, or in a combination of a curved line or a straight line, the penetration hole 131 may also be formed with a curved line or in a combination of a curved line or a straight line to correspond to the outline of the first portion 231.

A terminal unit (not shown) to which terminals of various cables are connected may be formed on the rear surface of the display body 110, and the terminal unit may be closed and opened by a terminal cover 150.

Referring to FIG. 5, the terminal cover 150 may include a penetration hole 151 through which a cable 10 passes. It is desirable that the penetration hole 151 is formed as close as possible to a first opening 241 (e.g., an upper end of the terminal cover 150) of a guide groove 240 (see FIG. 6) into which the cable 10 is inserted, and it is purposed to reduce a length of the cable 10 exposed between the display body 110 and the stand 200 to the outside. Therefore, the rear surface of the display apparatus may be kept simple by reducing a length of the cable exposed between the display body 110 and the stand 200.

Although not shown, the penetration hole 151 of the terminal cover 150 may be formed at a lower end of the terminal cover 150 in some cases.

Figure 6:
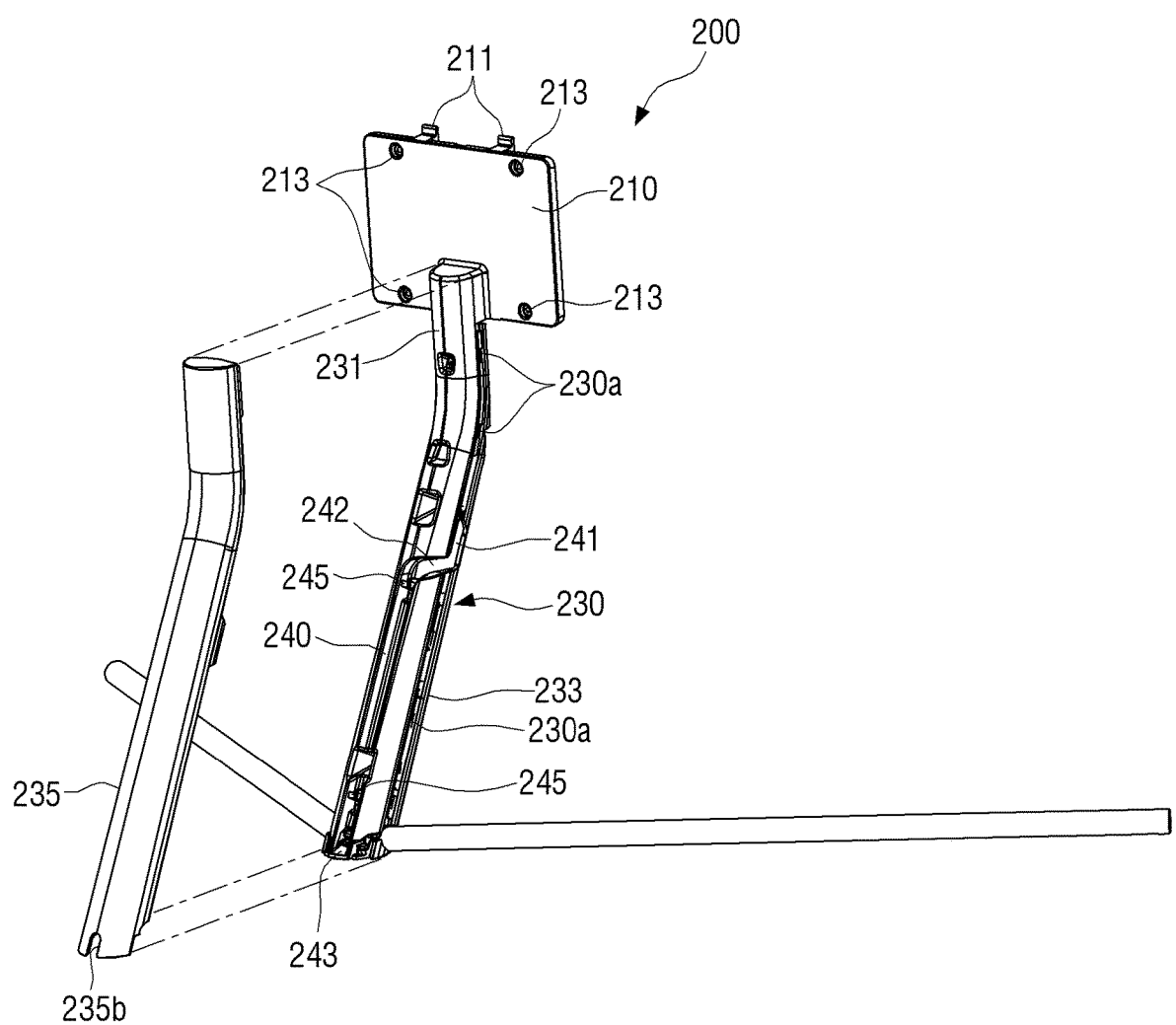
FIGS. 6 and 7 are exploded perspective views illustrating a stand.
Figure 7:
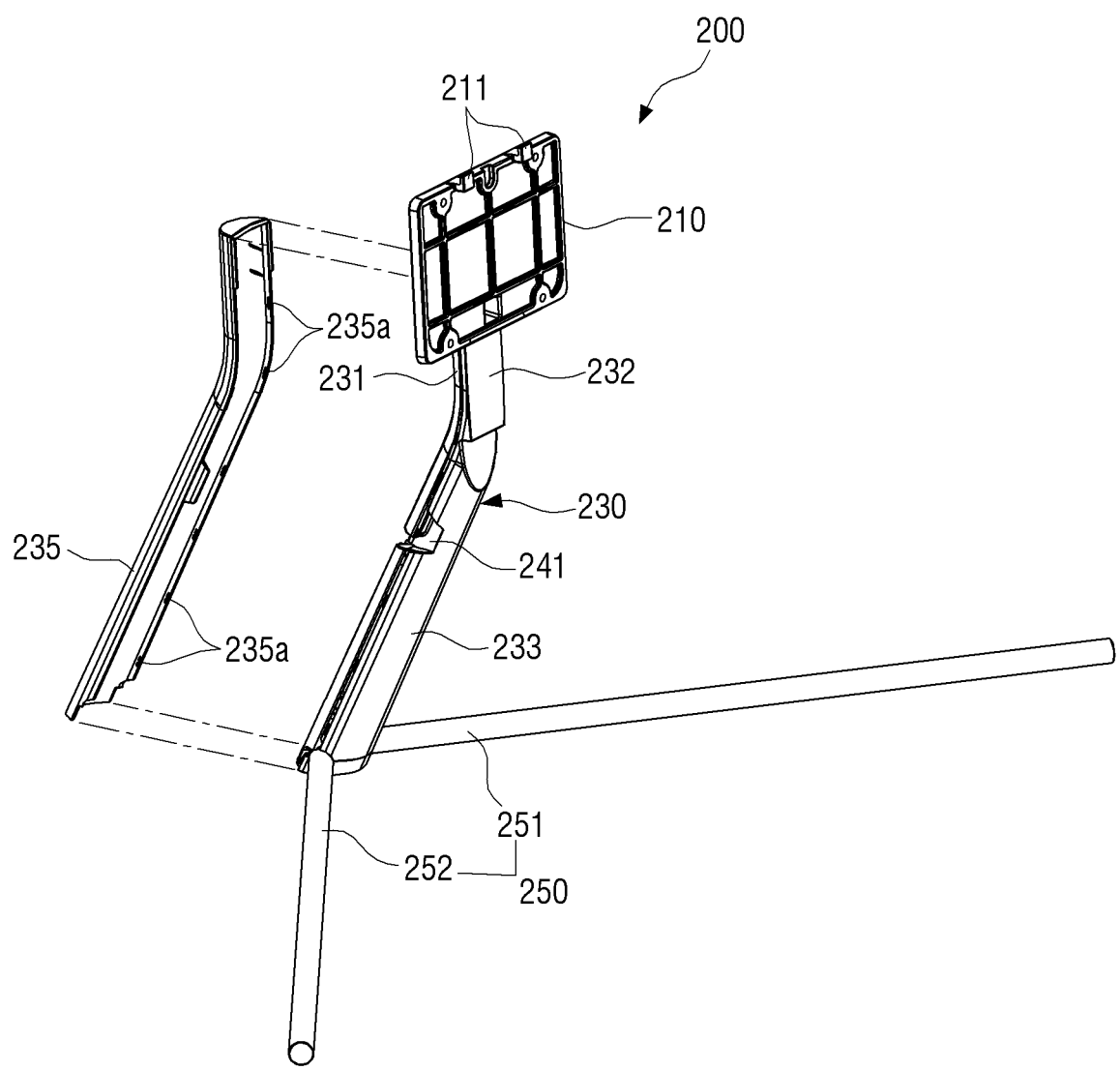

Hereinafter, the structure of the stand 200 will be detailed with reference to FIGS. 6 and 7. FIGS. 6 and 7 are exploded perspective views illustrating a stand.

A stand 200 may include a mounting member 120 mounted on a mounting groove 120, a support 230 vertically disposed and connected to the mounting member 210, and a base 250 connected to a lower end of the support 230.

As described above, the mounting member 210 may be detachably coupled to the mounting groove 120 formed on the rear surface 111 of the display body, and formed in a plate shape having a smaller thickness than a depth of the mounting groove 120. The mounting member 210 may include a plurality of engagement holes 213 coupled to a plurality of screws. The plurality of engagement holes 213 of the mounting member 210 may be disposed to respectively correspond to a plurality of engagement holes 124 formed on the mounting groove 120.

The support 230 may consist of a first portion 231 having an upper end connected to the rear surface of the mounting groove 210, and a second portion 233 rearwardly formed from a lower end of the first portion 231 (in a direction away from the display body 110). The second portion 233 may be rearwardly formed so as to stably support the display body 110 together with the base 250 considering the center of gravity of the display body 110. The second portion 233 may include the guide groove 240 into which the cable 10 is inserted.

The guide groove 240 may extend from a first opening 241 formed on one side of the second portion 233 to a second opening 243 formed at a lower end of the second portion 233. The guide groove 240 may be linearly formed from the second opening 243 in a length direction of the second portion 233, including a section 242 bent to one side of the second portion 233 to be connected to the first opening 241. The guide groove 240 may include the portion 242, so that the first opening 241 may be formed as close as possible to the penetration hole 151 of the terminal cover 150.

The guide groove 240 may include a fixing protrusion 245 for fixing the cable 10. When the cable 10 is formed available for clamping, the fixing protrusion 245 may more stably fix the cable 10.

A stand cover 235 may be detachably coupled to the rear of the support 230 to cover the guide groove 240. For coupling between the support 230 and the stand cover 235, a plurality of engagement grooves 230A may be formed along both sides at a predetermined interval, and a plurality of snap protrusions 235A which are snap-coupled to the plurality of engagement grooves 230A may be formed along the inside of both sides of the stand cover 235.

The stand cover 235 may conceal the complicated structure on the back of the support 230 such as the guide groove 240 into which the cable 10 is inserted and the fixing protrusion 245 to thereby maintain the outside of the stand 200 to be simple. The stand cover 235 may include a penetration hole 235B through which the cable 10 passes at a position corresponding to the second opening 243 when the stand cover 235 is in engagement with the support 230. When the cable 10 is drawn out to the outside of the stand through the penetration hole 235B of the stand cover 235, the cable 10 may be positioned at a surface on which the base 250 is mounted (a bottom surface or an upper surface of a desk). Accordingly, the cable 10 may not be recognizable by a user who watches a screen of the display apparatus in front of the display apparatus 100.

The base 250 may consist of a pair of stick members 251 and 252. The pair of stick members 251 and 252 may be symmetrically disposed with one ends of the stick members 251 and 252 connected to both sides of the lower end of the support 230. The pair of stick members 251 and 252 may be formed in a V shape toward the front of the display body 110 to stably support the display body 110 together with the support 230.

The display apparatus 100 may be used as a standing type since the stand 200 is mounted on the rear surface 111 of the display body 110.

Hereinafter, referring to FIGS. 8 to 12, the structure of a wall mount unit 300 for hanging the display 100 on a wall will be described in detail.

Figure 8:
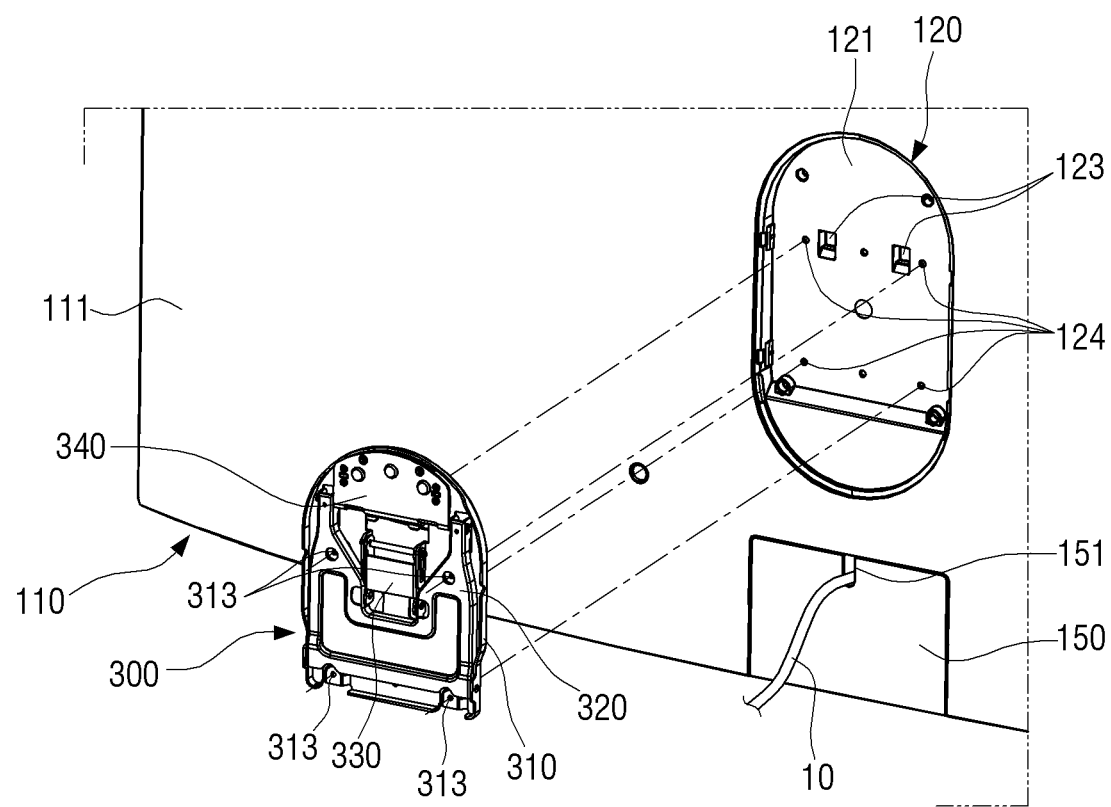
FIGS. 8 and 9 are perspective views illustrating that before and after a wall mount unit is mounted on a mounting groove of a display body.
Figure 9:
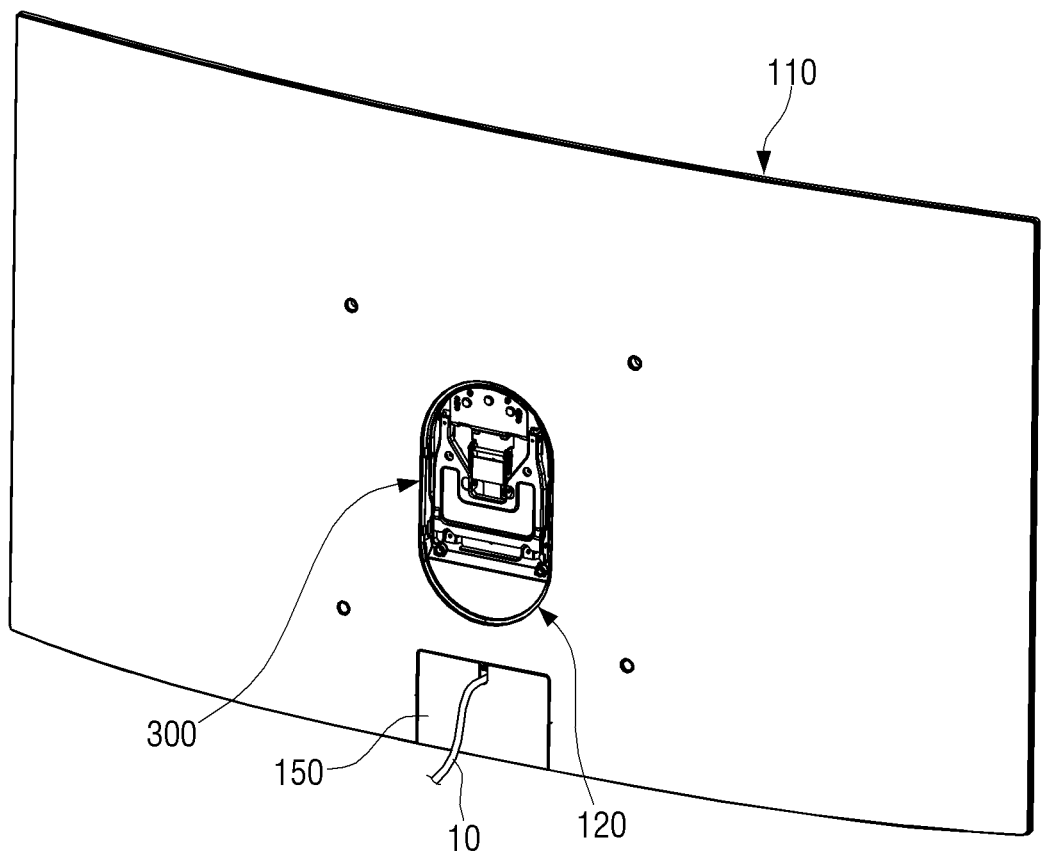
Figure 10:
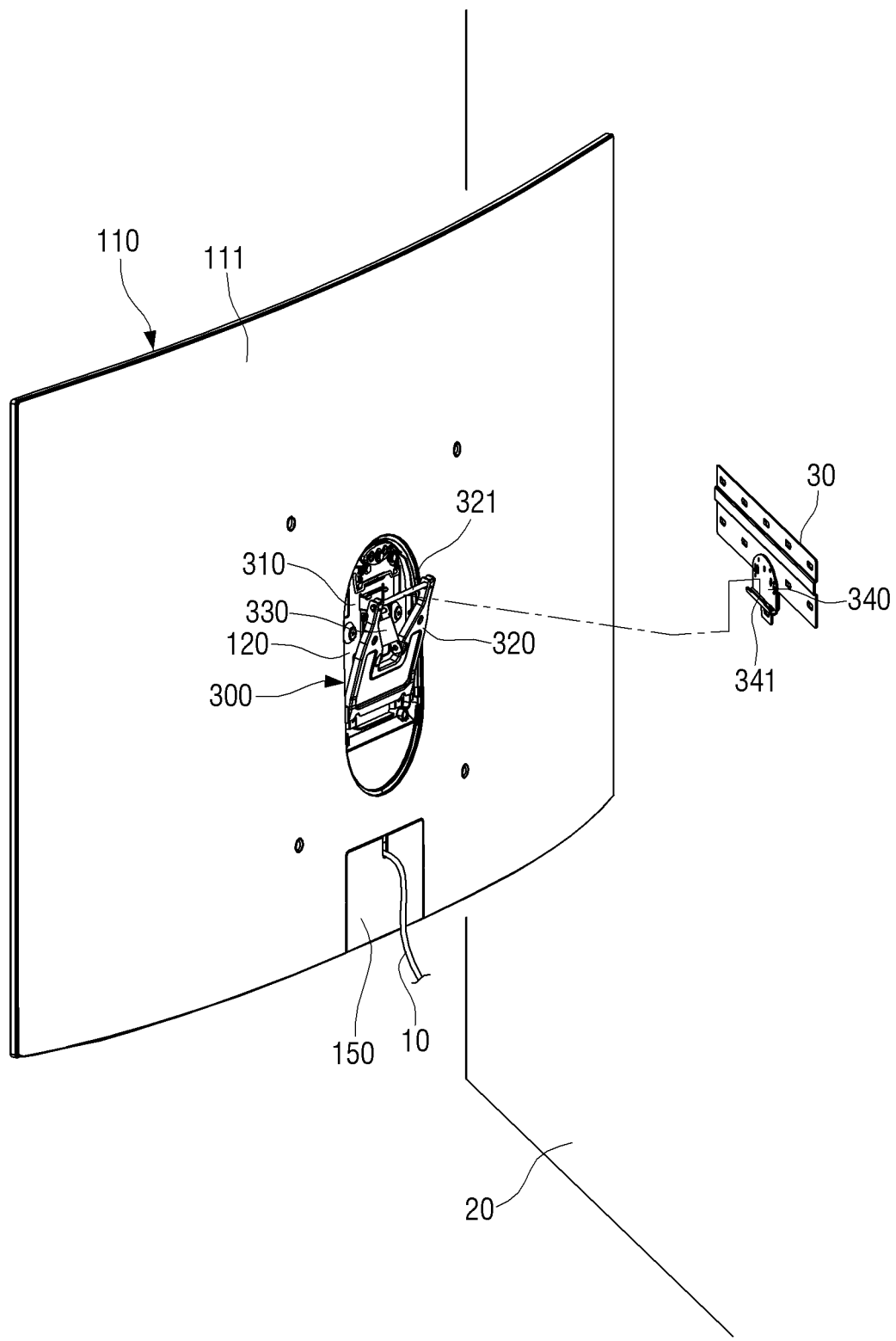
FIG. 10 is a perspective view illustrating a wall mount unit mounted on a display body and a fixing member mounted on a wall.
Figure 11:
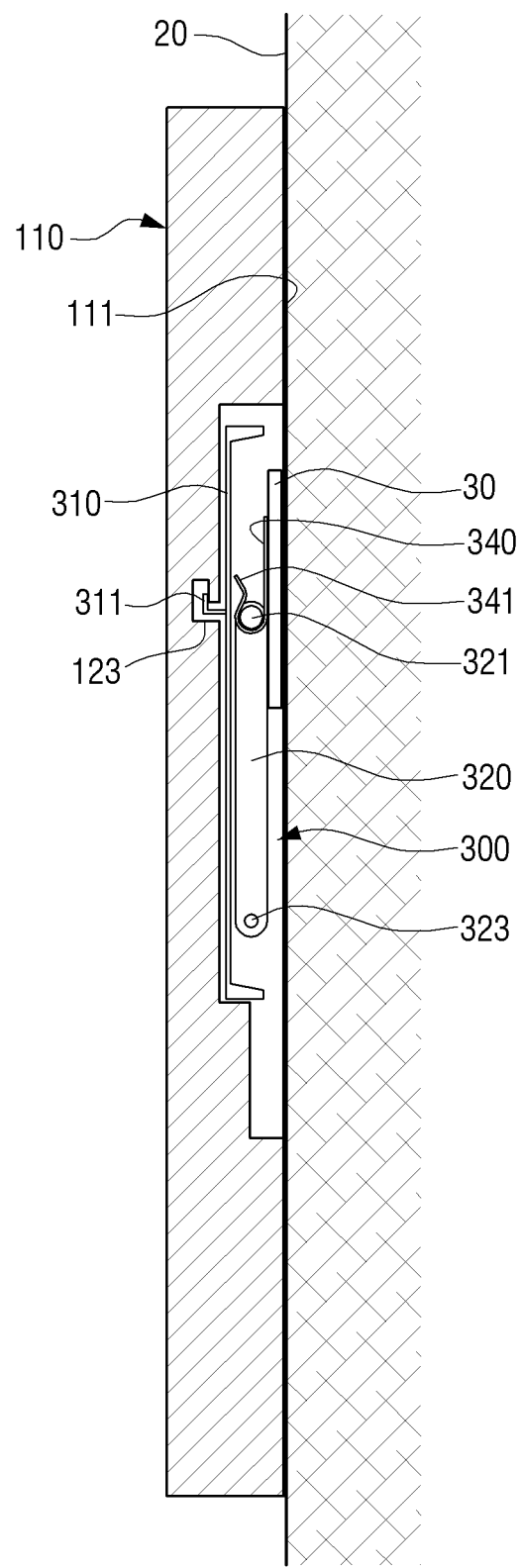
FIGS. 11 and 12 are schematic views illustrating that before and after tiling the display body hanging on a wall.
Figure 12:
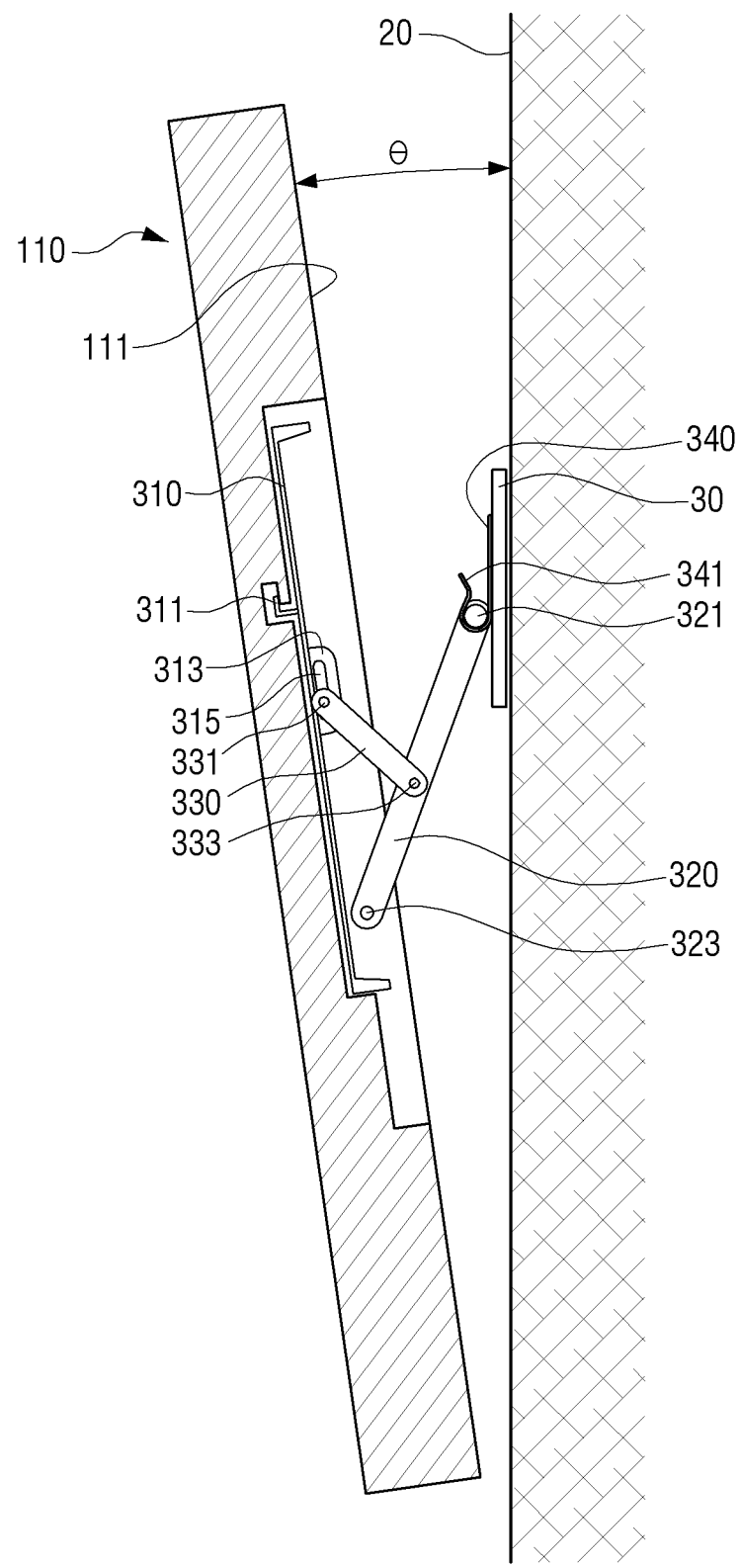

FIGS. 8 and 9 are perspective views illustrating that before and after a wall mount unit is mounted on a mounting groove of a display body, FIG. 10 is a perspective view illustrating a wall mount unit mounted on a display body and a fixing member mounted on a wall, and FIGS. 11 and 12 are schematic views illustrating that before and after tiling the display body hung on a wall.

Referring to FIG. 8, a wall mount unit 300 may be detachably mounted on the mounting groove 120 formed on the rear surface 111 of the display body 110. The display apparatus 100 may use the mounting groove 120 on which the mounting member 210 of the stand 200 is mounted without an additional mounting structure for mounting the wall mount unit 300 on the display body 110.

The wall mount unit 300 may include a bracket 310 fixed onto the mounting groove 120, a first link 320 connected to the bracket 310, a second link 330 connecting the bracket to the first link, and a fixing member 340 fixed onto a wall.

The bracket 310 may have the same mounting structure as the mounting member 210 of the stand 200. The bracket 310 may include a plurality of locking protrusions 311 (see FIG. 11) on a surface opposite to the mounting groove 120 and a plurality of engagement holes 313 engaged with a plurality of coupling screws.

When the bracket 310 is mounted on the mounting groove 120, the plurality of locking protrusions 311 may be inserted into a plurality of locking holes 123 of the mounting groove 120, and a plurality of screws may be sequentially coupled to the plurality of engagement holes 313 of the bracket 310 and the plurality of engagement holes 214 of the mounting groove 120.

The lower end of the first link 320 may be hinge-connected to the lower end of the bracket 310 through a first connection axis 323 (see FIG. 11). In addition, the first link 320 may include a hanging bar 321 at the upper end thereof to be hung on a hook 341 of the fixing member 340.

One end of the second link 330 may be hinge connected to the bracket 310 through a second connection axis 331, and the other end may be hinge connected to the first link 320 through a third connection axis 333. The second connection axis 331 may be slidably connected to an elongated hole 315 of a guide piece 313 formed in the bracket 310. Accordingly, the display body 110 may be tilted within a predetermined angle range while being hung on a wall as shown in FIG. 12.

Referring to FIG. 10, a fixing member 340 may be fixed onto a wall through an additional bracket 30 mounted on a wall 20. The fixing member 340 may include a hook 341 to hang a hanging bar 321 of the first link 320.

Referring to FIG. 9, when the wall mount unit 300 is mounted on the mounting groove 120 with the first link 320 being folded, a thickness of the wall mount unit 300 may be equal to or smaller than a depth of the mounting groove 320. Accordingly, when the display body 110 hangs on a wall through the wall mount unit 300, referring to FIG. 11, the rear surface 111 of the display body 110 may be closely attached to the wall 20. Therefore, the display body 110 may hang on the wall 20 as if a frame is hung on a wall. Therefore, the present disclosure may solve a problem of occupying a large space caused by a display body spaced apart from a wall with a large distance due to a wall mount unit protruding further from a wall, and a problem of giving an unstable feeling to a user. Therefore, the display apparatus 100 hanging on a wall may well go with the surrounding interior naturally.

The display body 110 may be tilted within a predetermined angle range (θ) as shown in FIG. 12. The tilting angle of the display body 110 may vary depending on a length of the third link 330. As a length of the third link 330 is increased, a tilting angle range may be increased, and as a length of the third link 330 is reduced, a tilting angle range may be reduced.

Hereinafter, various designs of stands that could be mounted on the display body 110 instead of the stand 200 will be described.

Referring to FIGS. 13 to 16, the structure of the display apparatus 100 according to another embodiment of the present disclosure will be described in detail.

Figure 13:
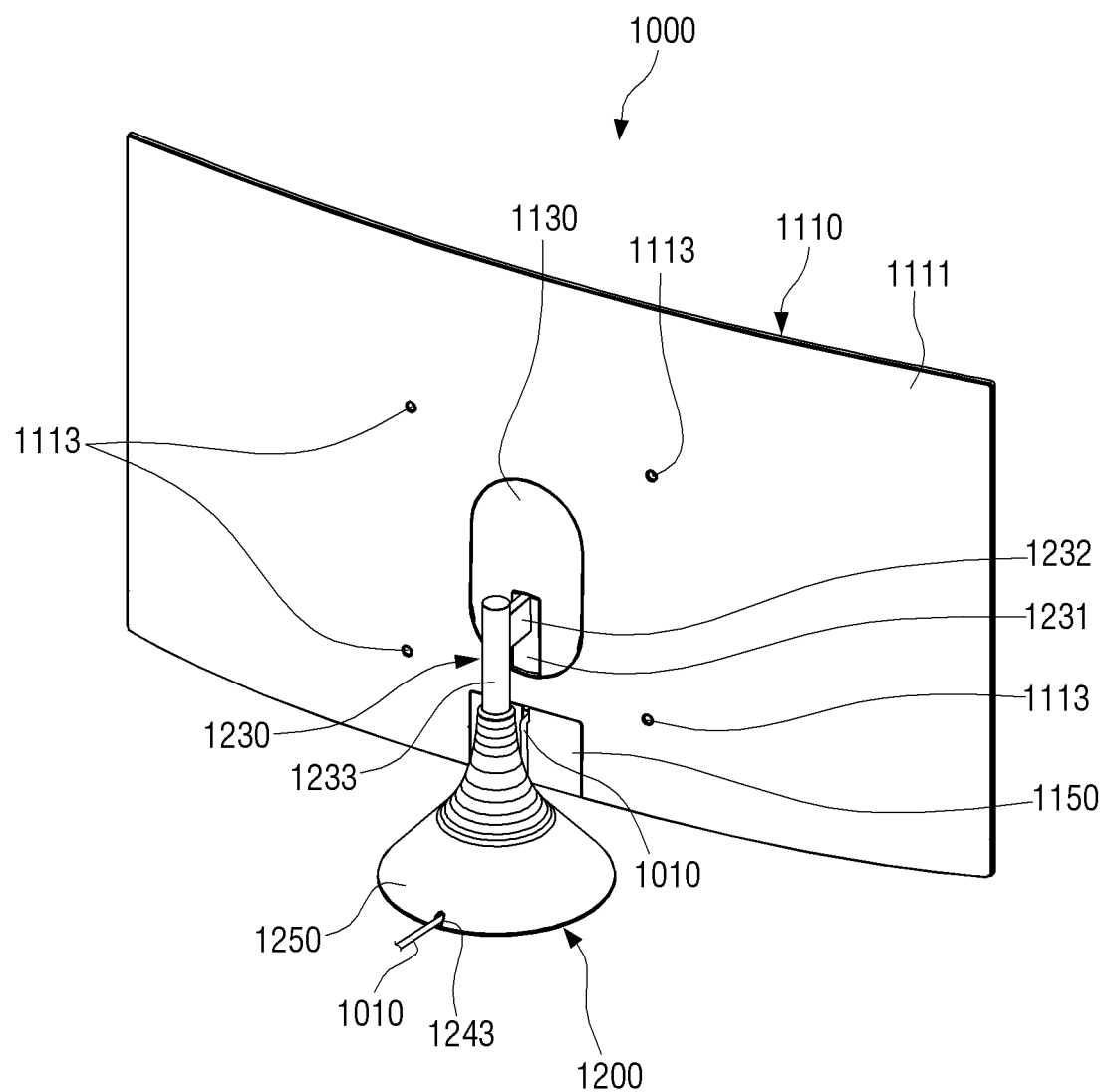
FIG. 13 is a perspective view illustrating a display apparatus according to another embodiment of the present disclosure.
Figure 14:
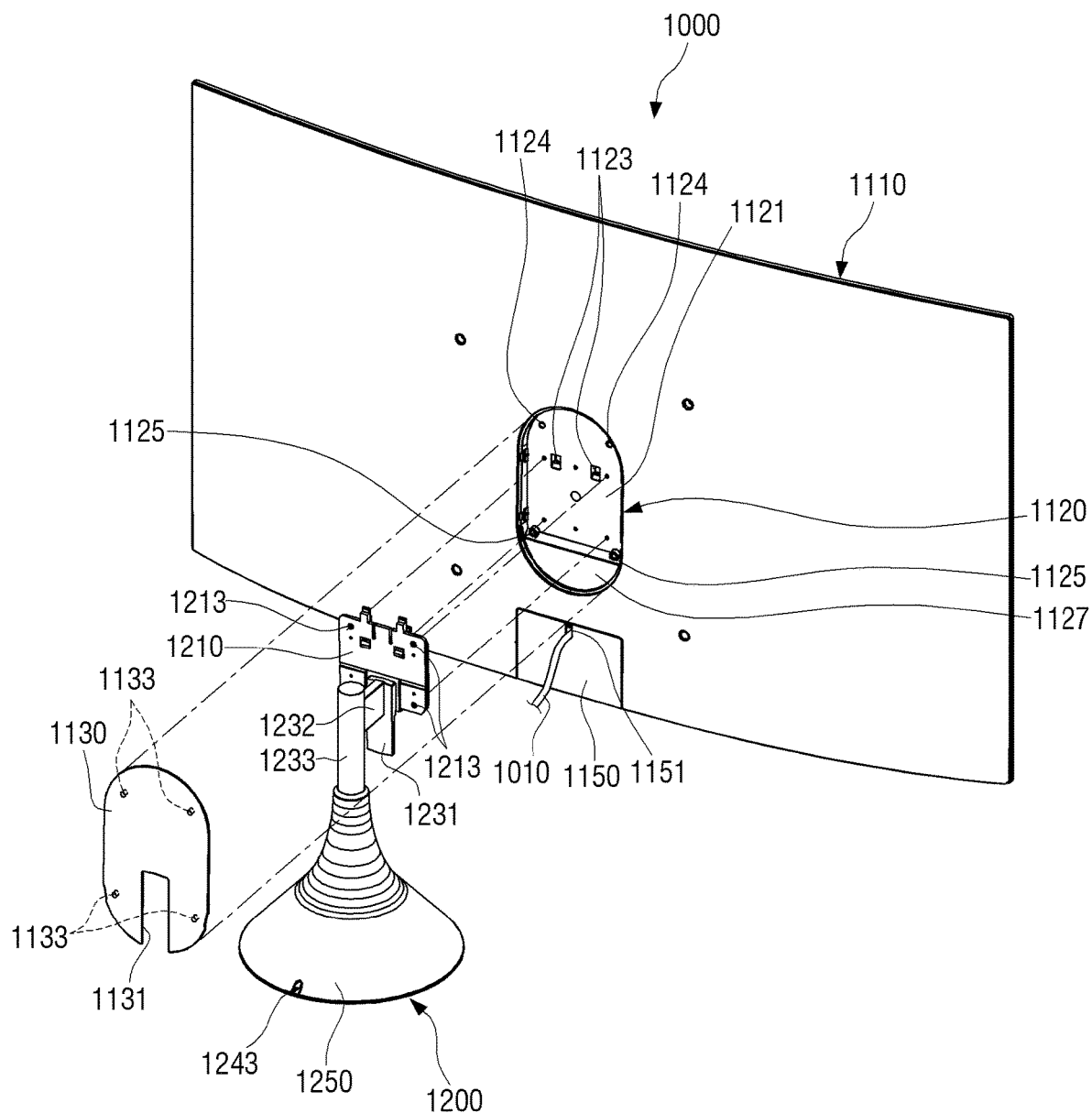
FIG. 14 is an exploded perspective view illustrating a display body, a stand and a display body cover of the display apparatus shown in FIG. 13.
Figure 15:
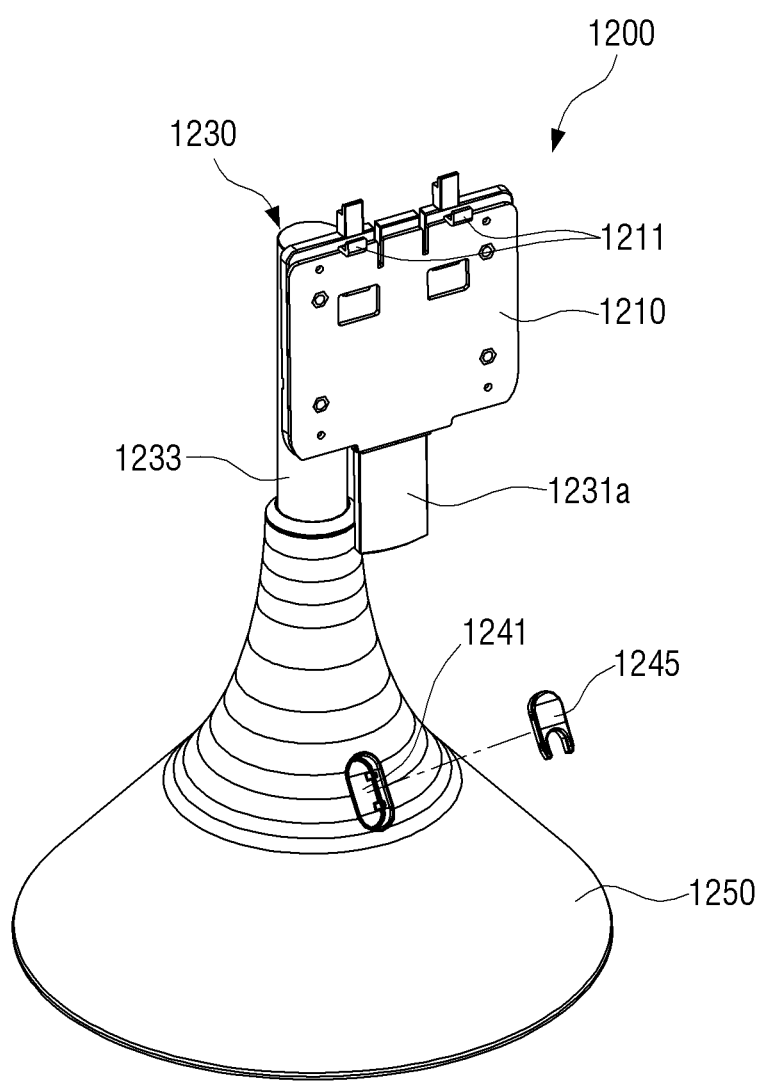
FIGS. 15 and 16 are a perspective view and a longitudinal cross-sectional view of the stand shown in FIG. 14.
Figure 16:
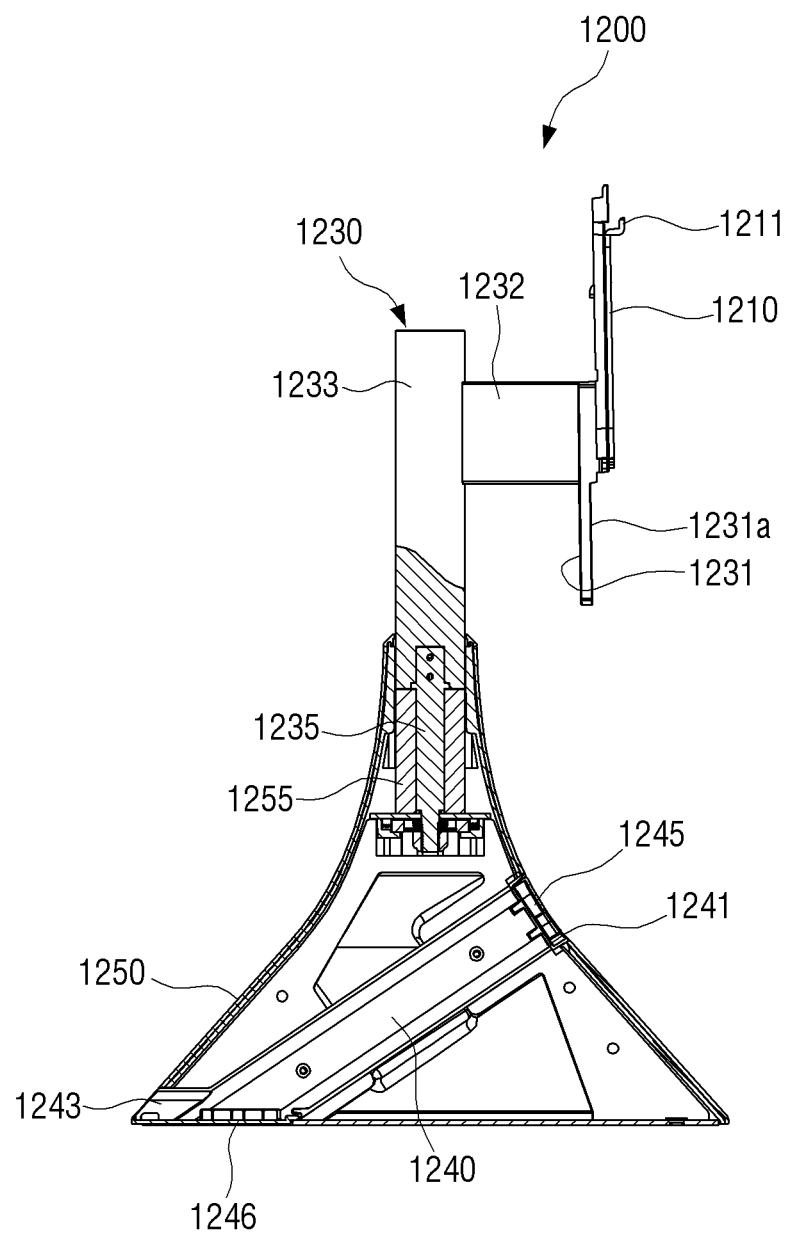

FIG. 13 is a perspective view illustrating a display apparatus according to another embodiment of the present disclosure, FIG. 14 is an exploded perspective view illustrating a display body, a stand and a display body cover of the display apparatus shown in FIG. 13 and FIGS. 15 and 16 are a perspective view and a longitudinal cross-sectional view of the stand shown in FIG. 14.

Referring to FIG. 13, a display apparatus 1000 may include a display body 1100, a stand 1200 supporting the display body 1100, and a display body cover 1130 covering a mounting groove 1120 of the display body 1100.

Since the display body 1100 is configured in the similar manner as the display body 1100 of the display apparatus 1000, like reference numeral of each configuration provided in the display body 110 is given to each configuration provided in the display body 1110, and the detailed description thereof will be omitted. Reference numeral 1113 of FIG. 13, which is not described, denotes VESA hole.

The stand 1200 may include a mounting member 1210 detachably mounted on the mounting groove 1120, a support 1230 connected to the mounting member 1210, a base 1250 to which the support 1230 is rotatably connected.

Referring to FIGS. 14 and 15, the mounting member 1210 may be formed in the similar manner as the mounting member 210 described above. The mounting member 1210 may include a plurality of locking protrusions 1211 detachably coupled to a plurality of locking holes 1123 formed on a first bottom surface 1121, and a plurality of engagement holes 1213 coupled to a plurality of screws. The plurality of engagement holes 1213 of the mounting member 1210 may be formed at positions respectively corresponding to a plurality of engagement holes 1124 formed in the mounting groove 1120.

The support 1230 may include a first portion 1231 coupled to a rear surface of the mounting member 1210, a second portion 1233 rotatably coupled to a base 1250 and a connection portion 1232 connecting the first and second portions 1231 and 1233.

The first portion 1231 may be closely attached to a second bottom surface 1127 when the mounting member 1210 is mounted on the first bottom surface 1121 of the mounting groove 1120. Accordingly, the stand 1200 may be mounted on the mounting groove 1120 with a maximum contact area so as to be firmly coupled to the display body 1110.

The second portion 1233 may be coupled to a rotational axis 1235 at a lower end thereof as shown in FIG. 16. The rotational axis 1235 may be rotatably coupled to an engagement unit 1255 disposed on an upper portion inside the base 1250. The support 1230 may rotate in a clockwise direction or in a counterclockwise direction with respect to the base 1250. When the stand 1200 is mounted on the display body 1110 due to such the engagement structure, the display body 1110 may rotate to the left and right at a predetermined angle.

A display body cover 2130 may be detachably coupled to the display body 1110 to cover the mounting groove 1120 so that the inside of the mounting groove 1120 may not be exposed to the outside. An outline of the display body cover 1130 may be formed in a shape corresponding to the mounting groove 1120. The display body cover 1130 may include a plurality of engagement protrusions 1133 on a surface opposite to the mounting groove 120.

Figure 18:
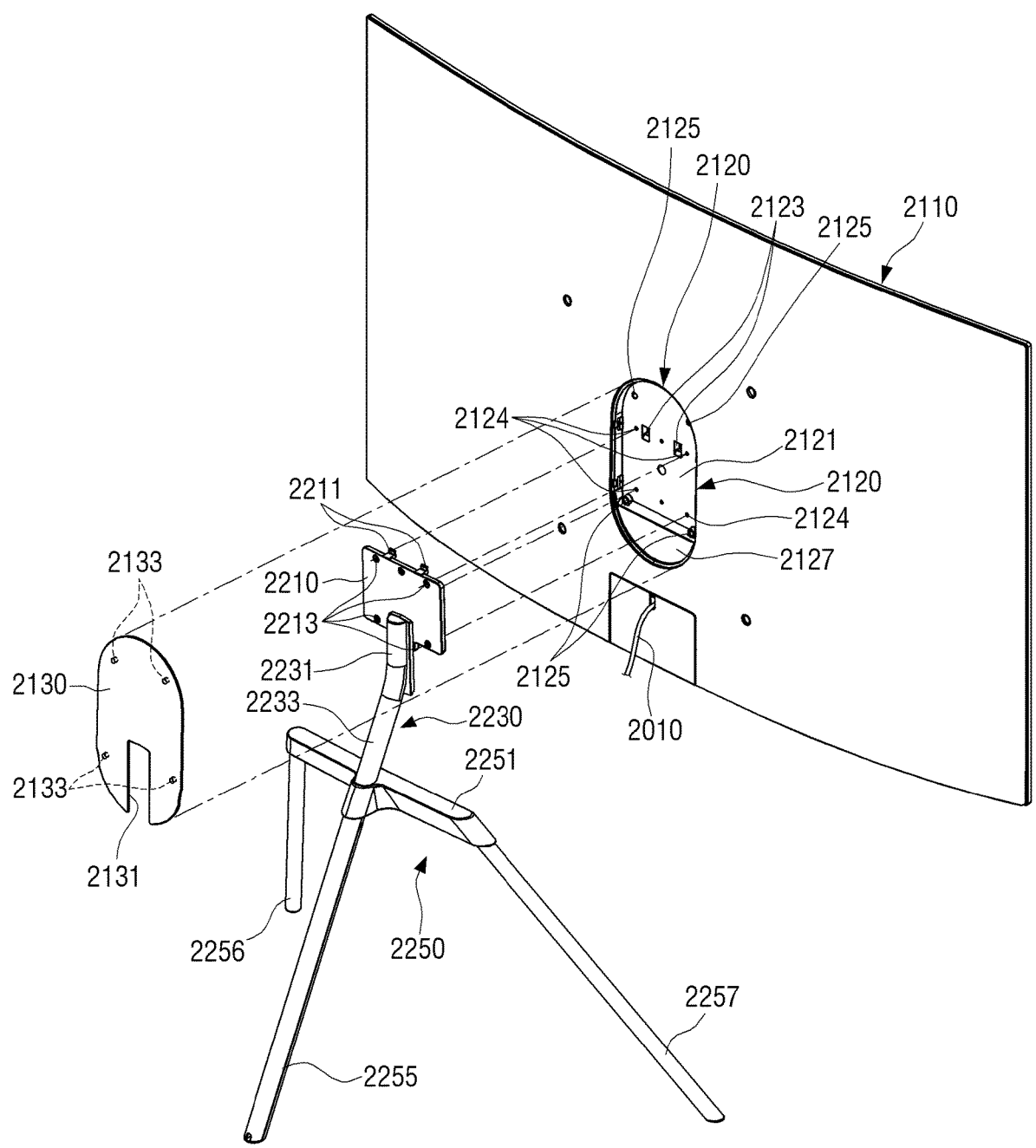
FIG. 18 is an exploded perspective view illustrating a display body, a stand and a display body cover of the display apparatus shown in FIG. 17.

When the display body cover 1130 covers the mounting groove 1120, referring to FIG. 18, a penetration hole 1131 through which a first portion 1231 passes of the support 1230 may be formed in the display body cover 1130. When the mounting groove 1120 is covered with the display body cover 1130, the penetration hole 1131 may be formed in a shape corresponding to the outline of the first portion 1231 to remove interference with the first portion 1231 of the support 1230.

The base 1250 may be formed in a conical shape gradually widening from the top to the bottom. Accordingly, the stand 1200 may firmly support the display body 1110 not to fall, and distribute the load delivered by the weight of the display body 1110 to the surface on which the stand 1200 is mounted.

A path 1240 through which the cable 1010 passes of the base 1250 may be formed obliquely toward the bottom of the base 1250 from a circumferential surface of the base 1250. The path 1240 may include a first opening 1241 having one end into which the cable 1010 is inserted, and a second opening 1243 having the other end from which the cable 1010 is drawn.

It is desirable that the path 1240 has an inner diameter greater that a diameter of the cable 1010 to allow the cable 1010 to easily pass through the path 1240. First and second caps 1245 and 1246 for fixing the cable 1010 may be detachably coupled to the first opening 1241 and the second opening 1243, respectively, so that the cable 1010 may not move.

It is desirable that the first opening 1241 is disposed as close as possible to the penetration hole 1151 of the terminal cover 1150 on the base 1250. It is purposed to reduce a length of the cable 1010 exposed between the display body 1110 and the stand 1200 by reducing a distance between the penetration hole 1151 of the terminal cover 11150 and the first opening 1241.

Referring to FIGS. 17 to 20, the structure of a display apparatus 2000 according to another embodiment of the present disclosure will be described in detail. The display apparatus 2000 may have a shape similar to an easel when the stand 2200 is mounted.

Figure 17:
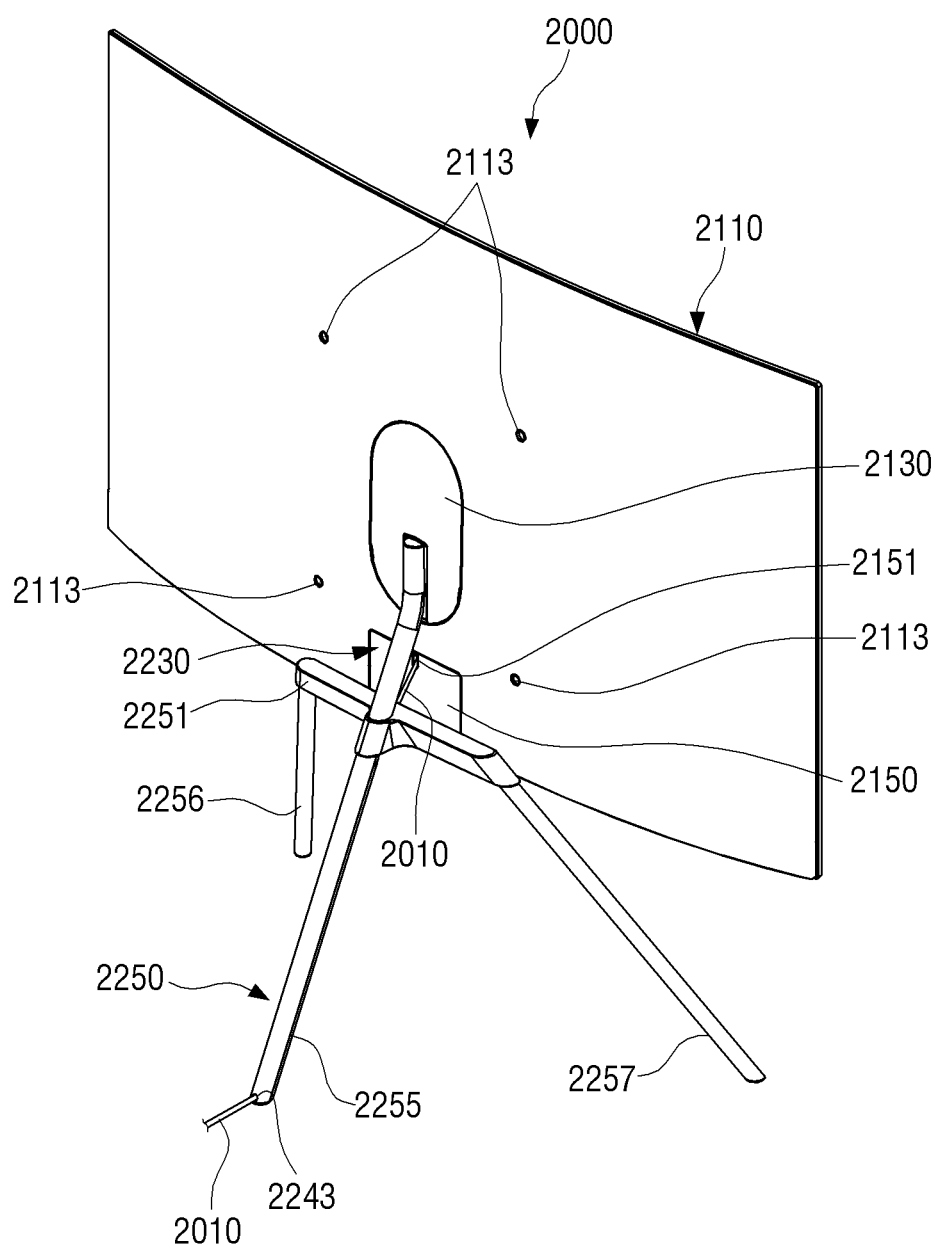
FIG. 17 is a perspective view illustrating a display apparatus according to another embodiment of the present disclosure.
Figure 19:
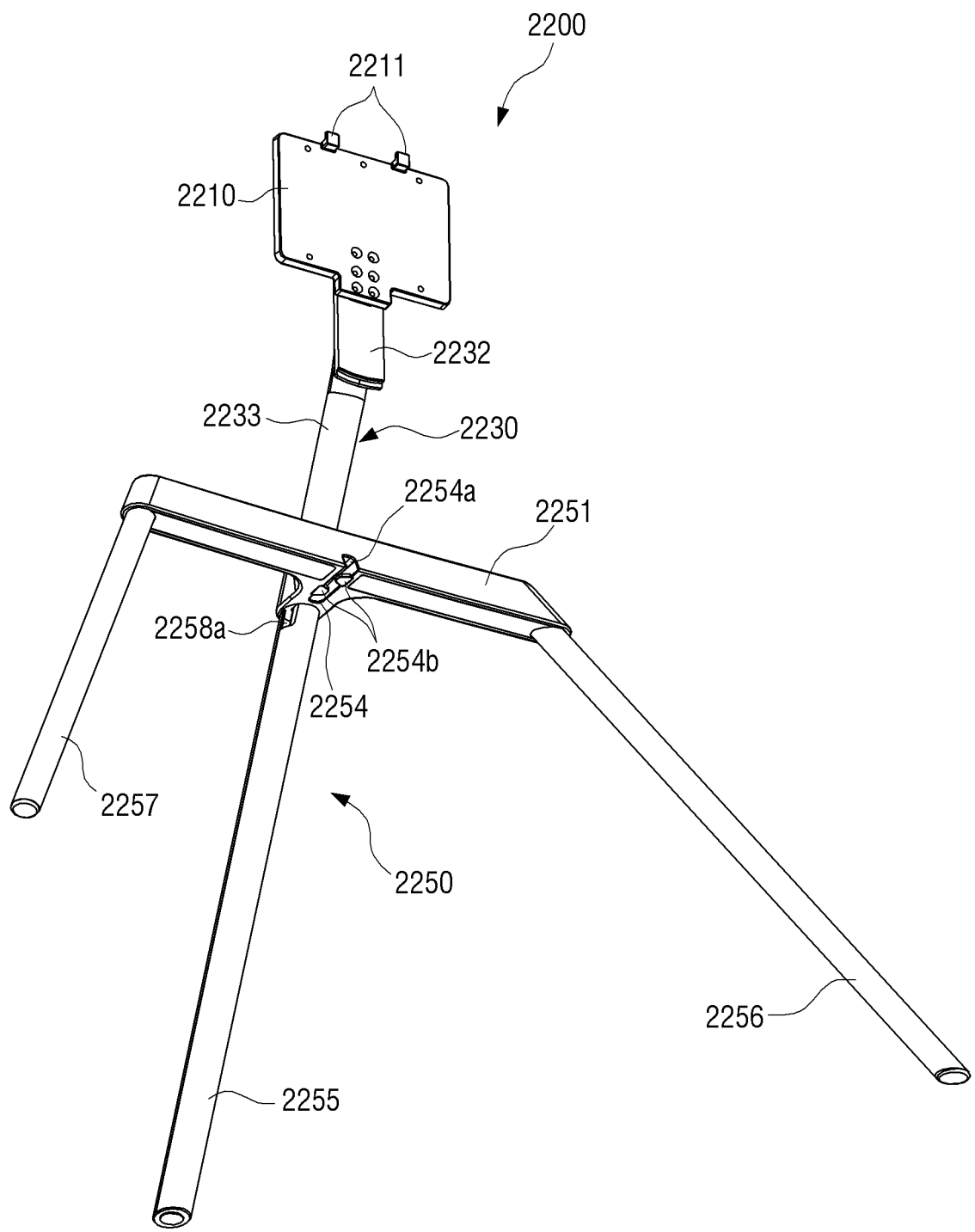
FIGS. 19 and 20 are perspective views illustrating the stand shown in FIG. 18.
Figure 20:
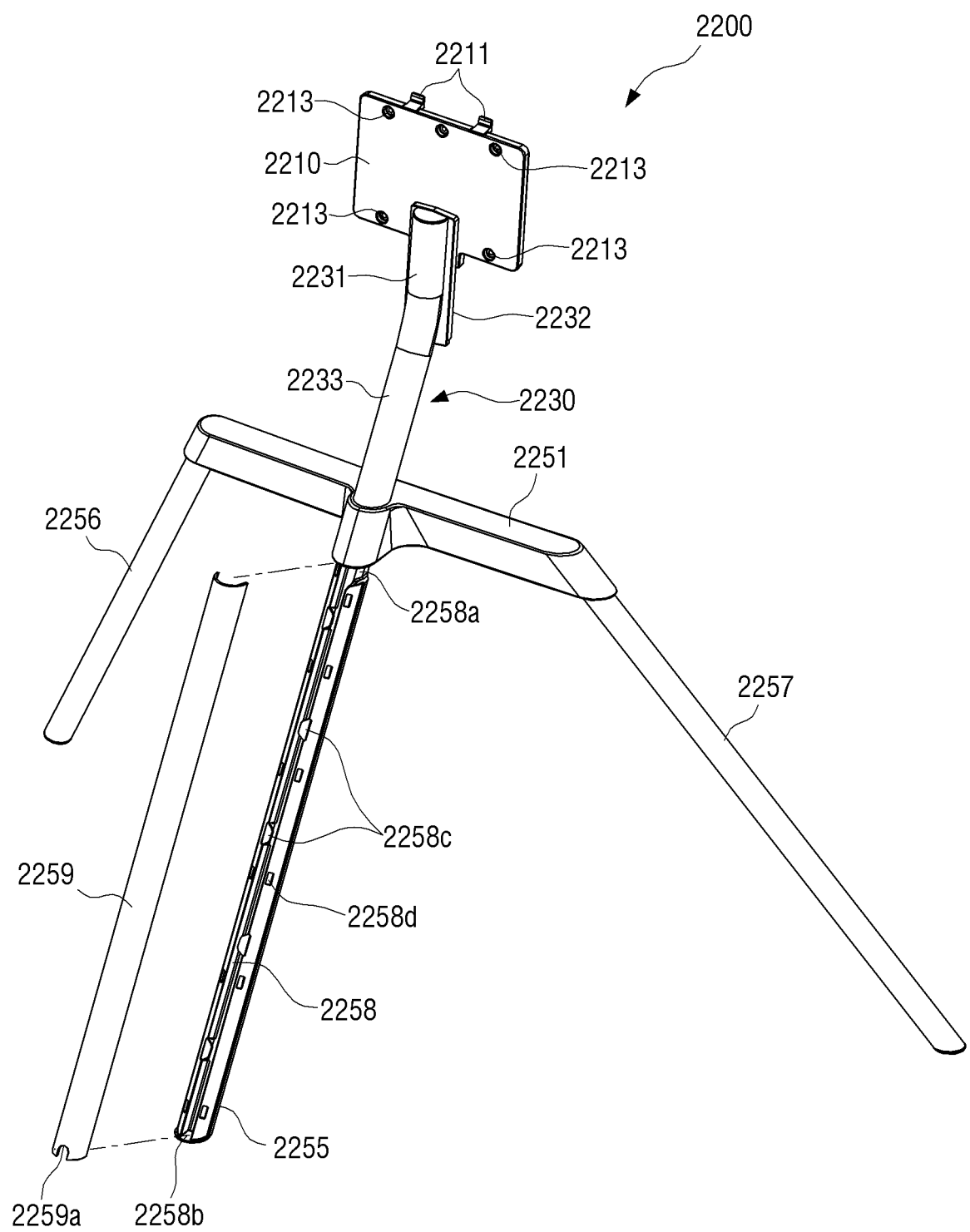

FIG. 17 is a perspective view illustrating a display apparatus according to another embodiment of the present disclosure, FIG. 18 is an exploded perspective view illustrating a display body, a stand and a display body cover of the display apparatus shown in FIG. 17, and FIGS. 19 and 20 are perspective views illustrating the stand shown in FIG. 18.

Referring to FIG. 17, a display apparatus 2000 may include a display body 2110, a stand 2200 supporting the display body 2110, and a display body cover 2130 for covering a mounting groove 2120 of the display body 2110.

Since the display body 2100 is configured in the same manner as the display body 110 of the display apparatus 100, like reference numeral of each configuration provided in the display body 110 is given to each configuration provided in the display body 2110, and the detailed description thereof will be omitted. Reference numeral 2113 of FIG. 17, which is not described, denotes VESA hole.

The stand 2200 may include a mounting member 2210 detachably mounted on the mounting groove 2120, a support 2230 connected to the mounting member 2210 and a base 2250 connected to the support 2230.

Referring to FIGS. 17 and 18, the mounting member 2210 may be formed in the similar manner as the mounting member 210. In other words, the mounting member 2210 may include a plurality of locking protrusions 2211 detachably coupled to the plurality of locking holes 2123 formed on the first bottom surface 2121, and a plurality of engagement holes 2213 coupled to a plurality of screws. The plurality of engagement holes 2213 of the mounting member 2210 may be formed at positions respectively corresponding to the plurality of engagement holes 2124 formed in the mounting groove 2120.

The support 2230 may consist of a first portion 2231 having an upper end connected to the rear surface of the mounting member 2210, and a second portion 2233 rearwardly formed from a lower end of the first portion 2231 (in a direction away from the display body 2110). The second portion 2233 may be rearwardly formed to stably support the display body 2110 together with the base 2250 considering the center of weight of the display body 2110.

One surface 2232 of the first portion 2231 may be closely attached to a second bottom surface 2127 of the mounting groove 2120 when the mounting member 2210 of the stand is mounted on the mounting groove 2120. Therefore, the stand 2200 may be mounted on the mounting groove 2120 with a maximum contact area so as to be firmly coupled to the display body 2110.

The base 2250 may include a frame 2251 coupled to the support 2230 and a plurality of bridges 2255, 2256 and 2257 connected to the frame 2251.

Referring to FIG. 19, the frame 2251 may be approximately disposed in a vertical direction, and a lower end of the support 2230 may be coupled to a center of an upper surface. The frame 2251 may include a connection groove 2254 into which a cable 2010 is inserted on a lower surface. The connection groove 2254 may guide the cable 2010 to the guide groove 2240. It is desirable that an inlet 2254A of the connection groove 2254 is disposed as close as possible to the penetration hole 2151 of the terminal cover 2150 as shown in FIG. 17.

The connection groove 2254 may be disposed in a direction toward the first bridge 2255 disposed at the center of the plurality of bridges. The cable 2010 drawn out from the penetration hole 2151 of the terminal cover 2150 may be inserted, and a plurality of fixing protrusions 2254A and 2254B may be disposed at a periphery of the connection groove 2254 so that the cable 2010 may not be deviated from the connection groove 2254.

An upper end of each of the plurality of bridges 2255, 2256 and 2257 may be coupled to the bottom surface of the frame 2251 and disposed in different directions to distribute the load of the display body 2110. The first bridge 2255 disposed at the center of the plurality of bridges may be arranged in an axis direction same as the support 2230, and the second and third bridges 2256 and 2257 may be symmetrically disposed on both sides of the frame 2251 based on the first bridge 2255.

Referring to FIG. 20, the first bridge 2255 may include a guide groove 2258 so that the cable 2010 is inserted in a length direction of the first bridge 2255. A first opening 2258A may be formed adjacent to the connection groove 2254 at an upper end of the first bridge 2255, and a second opening 2258B from which the cable 2010 is drawn may be formed at a lower end. The guide groove 2258 may be extended from the second opening 2258B to the inlet 2254A of the connection groove 2254. The cable 2010 drawn out from the penetration hole 2151 of the terminal cover 2150 may be inserted into the connection groove 2254 and the guide groove 2240 to be drawn out to the outside through the second opening 2258B of the first bridge 2255.

A plurality of fixing protrusions 2258C may be formed at a periphery of the guide groove 2240 so that the cable 2010 may not be deviated from the guide groove 2240.

A stand cover 2259 may be detachably coupled to the rear of the first bridge 2255 to cover the guide groove 2240. For coupling between the first bridge 2255 and the stand cover 2259, a plurality of engagement grooves 2258B may be formed along both sides of the first bridge 2255 at a predetermined interval, and a plurality of snap protrusions (not shown) snap-coupled to the plurality of engagement groove 2258B may be formed along the inside of the rims of both sides of the stand cover 2259.

Since the cable 2010 is concealed by the frame 2251 and the stand cover 2259, the display apparatus 2000 may maintain a neat appearance.

Referring to FIGS. 21 to 26, the structure of a display apparatus 3000 according to another embodiment of the present disclosure will be described in detail.

Figure 21:
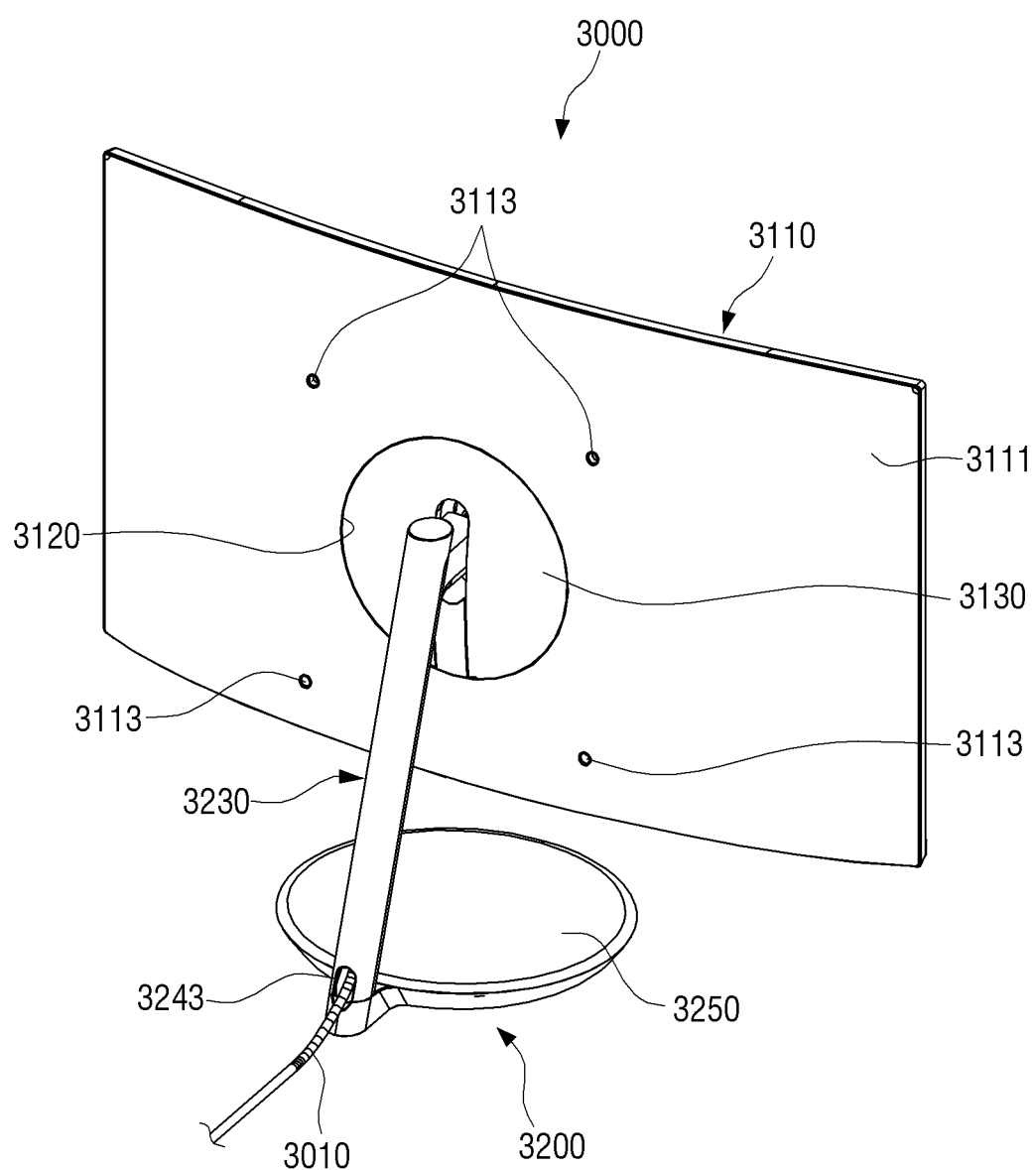
FIG. 21 is a perspective view illustrating a display apparatus according to another embodiment of the present disclosure.
Figure 22:
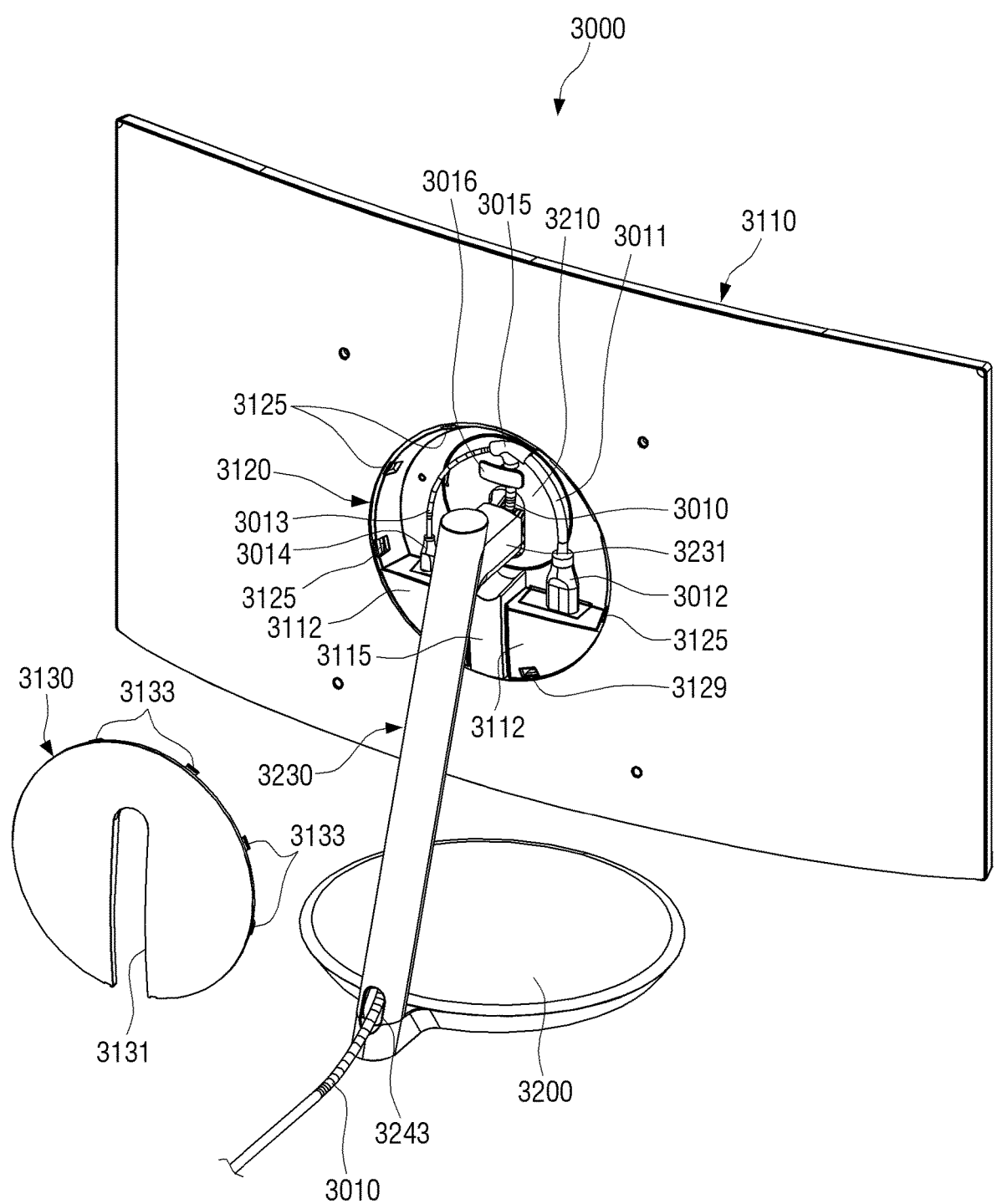
FIG. 22 is an exploded perspective view illustrating that a stand is mounted on a display body of the display apparatus shown in FIG. 21, and a display body cover is detached from the display body.
Figure 23:
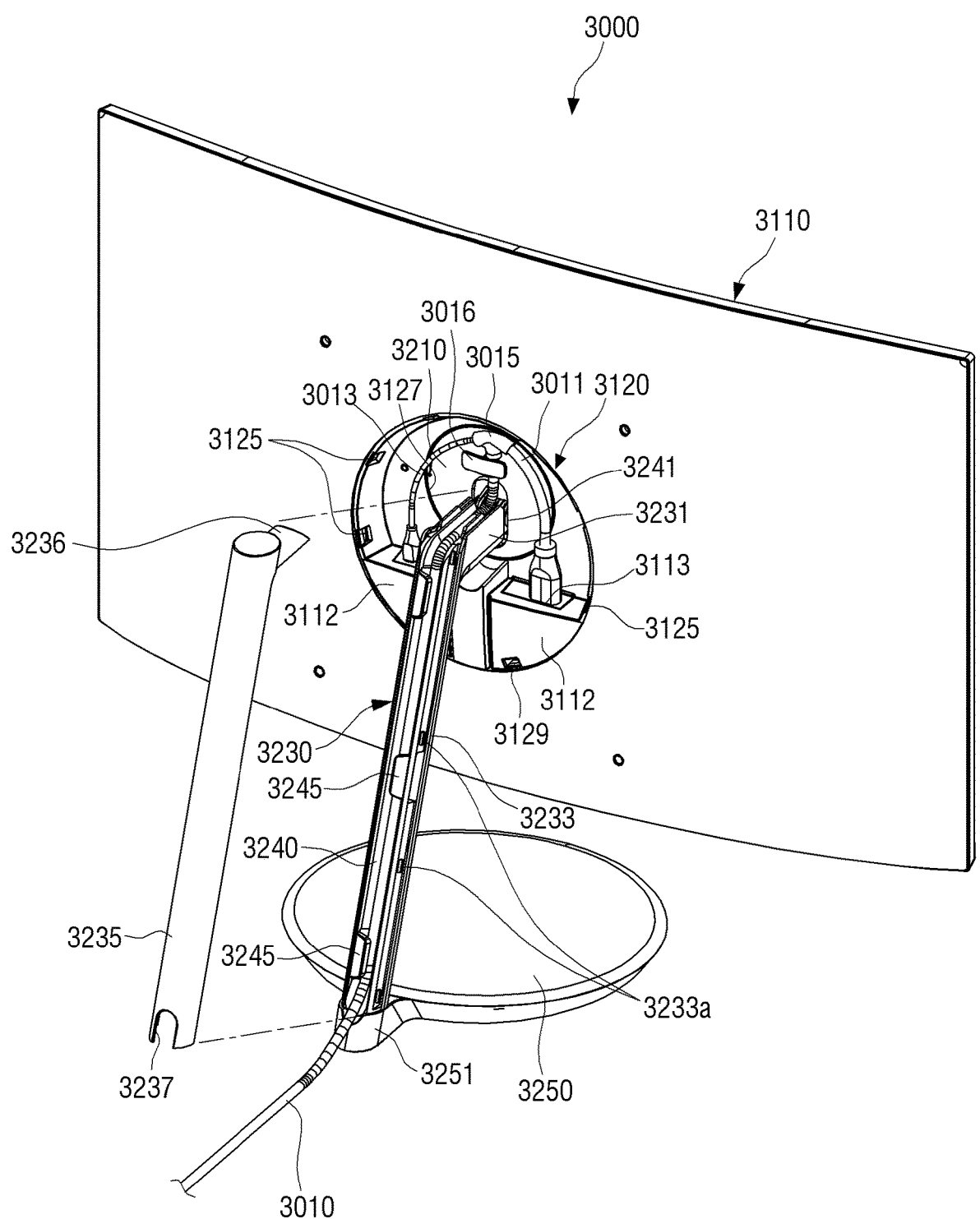
FIG. 23 is a perspective view illustrating that a stand cover is detached from a stand.
Figure 24:
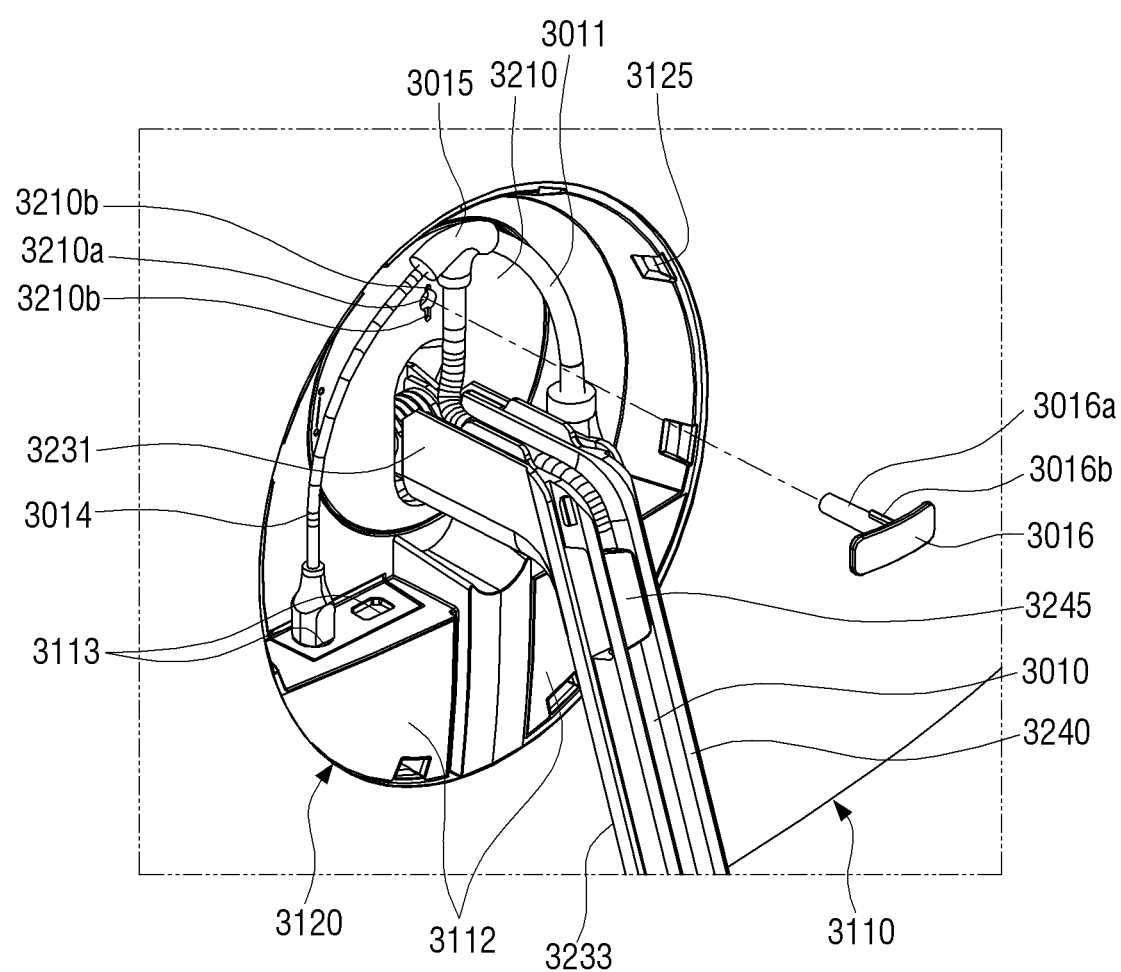
FIG. 24 is a perspective view illustrating that a cable fixing holder for fixing a cable in a mounting groove is detached from a mounting member of a stand.
Figure 25:
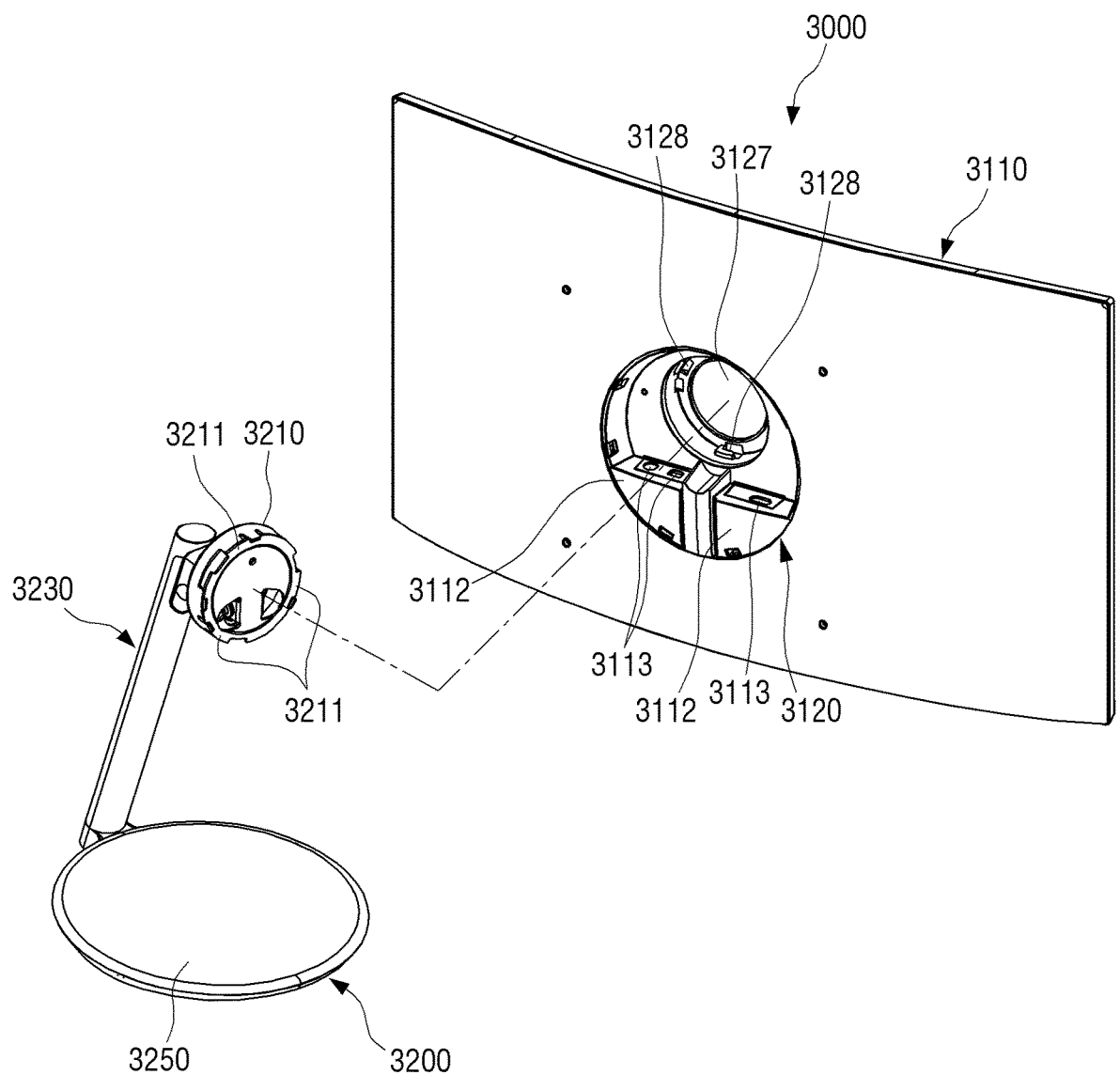
FIG. 25 is a perspective view illustrating a structure of a mounting groove of a display body and configuration of a mounting member of a stand.
Figure 26:
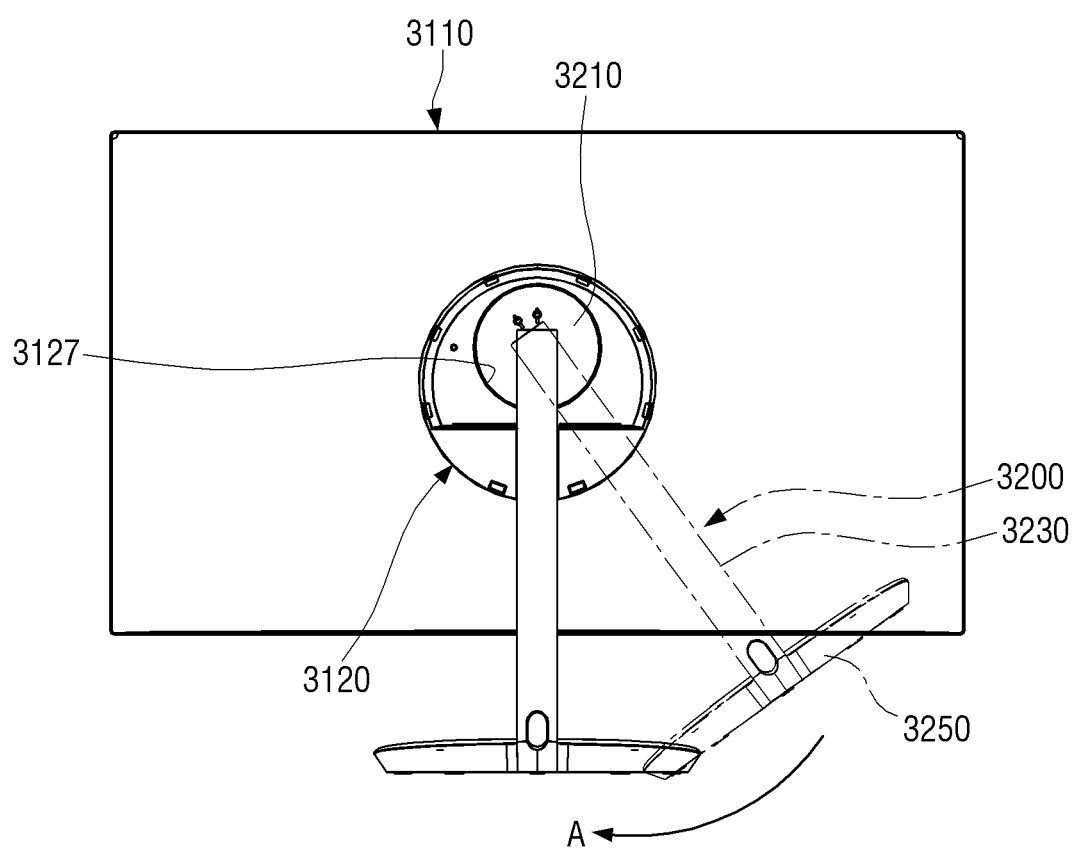
FIG. 26 is a schematic view illustrating a process of mounting a stand.

FIG. 21 is a perspective view illustrating a display apparatus according to another embodiment of the present disclosure, FIG. 22 is an exploded perspective view illustrating that a stand is mounted on a display body of the display apparatus shown in FIG. 21, and a display body cover is detached from the display body, FIG. 23 is a perspective view illustrating that a stand cover is detached from a stand, FIG. 24 is a perspective view illustrating that a cable fixing holder for fixing a cable in a mounting groove is detached from a mounting member of a stand, FIG. 25 is a perspective view illustrating a structure of a mounting groove of a display body and configuration of a mounting member of a stand, and FIG. 26 is a schematic view illustrating a process of mounting a stand.

Referring to FIG. 21, a display apparatus 3000 according to another embodiment of the present disclosure may include a display body 3110, a display body cover 3130 covering a mounting groove 3120 formed on a rear surface 3111 of the display body 3110 and a stand 3200 supporting the display body 3110

Referring to FIG. 22, a signal cable 3011 and a terminal unit 3112 respectively connected to terminals 3012 and 3014 of a power cable 3013 may be disposed in the mounting groove 3120 of the display body 3110.

A plurality of connection ports 3113 to which the respective terminals 3012 and 3014 are connected may be disposed on an upper surface of the terminal unit 3112. Since the plurality of connection ports 3113 are disposed to face the upper surface, a user may easily connect or detach the terminals 3012 and 3014 to or from the plurality of connection ports 3113. The terminal unit 3112 may be divided into two areas, and it is purposed to allow the plurality of cables 3011 and 3013 to be organized in a narrow mounting groove 3120.

In addition, an engagement groove 3127 detachably coupled to the mounting member 3210 of the stand 3230 may be formed in the mounting groove 3120 unlike the above described embodiments.

Referring to FIG. 25, the engagement groove 3127 may include a plurality of coupling units 3128 circumferentially with a predetermined interval along an inner circumferential surface. A plurality of engagement protrusions 3211 of the mounting member 3210 may be detachably press-coupled to the plurality of coupling units 3128. The process of coupling the mounting member 3210 to the engagement groove 3127 will be described below.

The display body cover 3130 may conceal the complicated structure inside the mounting groove 3120 by covering the mounting groove 3120. The outline of the display body over 3130 may be formed in a shape corresponding to the outline of the mounting groove 3120, and when the display body cover 3130 is coupled to the mounting groove 3120, a penetration hole 3131 may be formed so that the first portion 3231 of the support 3230 may not be interfered.

It is desirable that the shape of the penetration hole 3131 of the display body cover 3130 is formed so that the outline of the first portion 3231 corresponds to the outline of a dummy block 3115 inside the mounting groove 3120. The dummy block 3115 may be coupled to the penetration hole 3131 when the display body cover 3130 is coupled to the mounting groove 3120, thereby giving a sense of unity with the display body cover 3130 in design.

The display body cover 3130 may be snap-coupled to the mounting groove 3120. For such the snap coupling structure, a plurality of snap protrusions 3133 may be formed in the display body cover 3130 along a rim at a predetermined interval, and a plurality of engagement grooves 3125 to which the plurality of snap protrusions 3133 are snap-coupled may be formed in the mounting groove 3120. In this case, a plurality of locking protrusions (see 3135 of FIG. 27) may be formed at a lower end of the display body cover 3130. The plurality of locking protrusions may be inserted into a plurality of engagement holes 3129 formed at a lower end of the mounting groove 3120 before snap coupling the display body cover 3130 to the mounting groove 3120 and may serve as a pivot for rotating the display body cover 3130. When the plurality of locking protrusions are inserted into the plurality of engagement holes 3129, and the display body cover 3130 is rotated toward the mounting groove 3120, the plurality of snap protrusions 3133 may be easily snap-coupled to the plurality of engagement grooves 3125 of the mounting groove 3120.

Referring to FIG. 23, a stand 3200 may include a mounting member 3210, a support 3230 connected to the mounting member 3210, and a base 3250 connected to the support 3230.

The mounting member 3210 may be detachably coupled to an engagement groove 3127 formed in the mounting groove 3120 as described above.

When the mounting member 3210 is coupled to the mounting groove 3120, as shown in FIG. 26, the mounting member 3210 may be inserted into the engagement groove 3127 with the stand 3200 being obliquely disposed. In this case, a plurality of engagement protrusions 3211 of the mounting member 3210 may be disposed at a position which is not interfered by a plurality of coupling units 3128. When the stand 3200 is rotated in a direction of arrow A, the plurality of engagement protrusions 3211 of the mounting member 3210 may be coupled to the plurality of coupling units 3128 in a pressurized state. The mounting member 3210 may be coupled to the engagement groove 3127 without screw engagement unlike the mounting members 210, 1210 and 2210 as described above.

The support 3230 may consist of a first portion 3231 having a front end connected to the rear surface of the mounting member 3210, and a second portion 3233 rearwardly formed from the rear end of the first portion 3231 (in a direction away from the display body 3110). The second portion 3233 may be rearwardly formed to stably support the display body 3110 with the base 3250 considering the center of gravity of the display body 3110.

A guide groove 3240 into which a cable 3010 is inserted may be formed in the first and second portions 3231 and 3233. The guide groove 3240 may be formed from a front end of the first portion 3231 to a bottom end of the second portion 3233. The front end of the first portion 3231 may be disposed in the mounting groove 3120, and the terminal unit 3112 may be disposed in the mounting groove 3120. Thus, unlike the above described embodiments, the cable 3010 may not be exposed to the outside.

A plurality of fixing protrusions 3245 for fixing the cable 3010 may be formed along a periphery of the guide groove 3240 at a predetermined interval. The plurality of fixing protrusions 3245 may be formed in a zigzag shape so that the cable 3010 may be easily inserted into or detached from the guide groove 3240.

A stand cover 3235 may be detachably coupled to the support 3230 along a backside of the support 3230 to cover the guide groove 3240. In this case, for coupling between the support 3230 and the stand cover 3235, a plurality of engagement groove 3233A may be formed along both sides of the support 3230 with a predetermined interval, and the a plurality of snap protrusions (not shown) snap-coupled to the plurality of engagement grooves 3233A may be formed along the inside of the rims of both sides of the stand cover 3235.

An extension unit 3236 may be formed at an upper end of the stand cover 3235 to cover the guide groove 3240 of the first portion 3231, and a penetration hole 3237 may be formed so that the cable 3010 may be drawn out from the guide groove 3240 at a lower end of the stand cover 3235. The stand cover 3235 may conceal the complicated structure of the support 3230 such as the guide groove 3240 in which the cable 3010 is inserted and the fixing protrusion 3245, so that the outside of the stand 3200 may be kept simple and organized.

A back end 3251 of the base 3250 may be combined with a lower end of the support 3230. The base 3250 may have an approximate disc shape, and the load of the display body 3110 may be distributed onto the surface on which the base 3250 is mounted.

Referring to FIG. 24, the cable 3010 may be inserted into the guide grove 3240 with one line, and a portion of the cable in the mounting groove 3120 may be branched into a signal cable 3011 and a power source cable 3014. In this case, the cable 3010 may be disposed in a T shape.

A branch guide tube 3015 may be coupled to a portion where the cable 3010 is branched. In addition, a cable fixing hole 3016 may be arranged to fix the cable 3010 in the mounting groove 3120.

The cable fixing hole 3016 may include an engagement protrusion 3016A press-combined with an engagement hole 3210A formed on a rear surface of the mounting member 3210. In addition, the cable fixing hole 3016 may include a plurality of rotation prevention protrusions 3016A at an outer circumference of the engagement protrusion 3106A so that the engagement protrusion 3016A may not rotate while being combined with the engagement hole 3210A. The plurality of rotation prevention protrusions 3016B may be combined with a plurality of elongated holes 3210B extending from the engagement hole 3210A.

Figure 27:
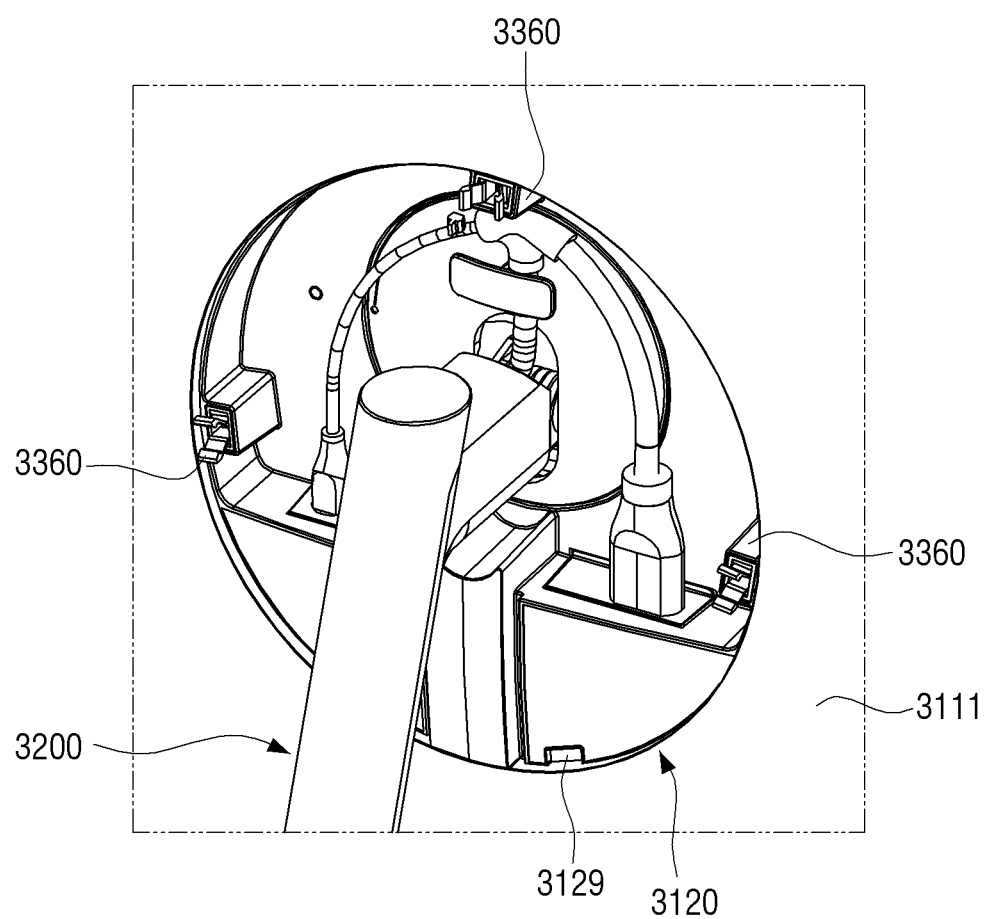
FIG. 27 is a perspective view illustrating an engagement structure where a display body cover is engaged with a mounting groove.
Figure 28:
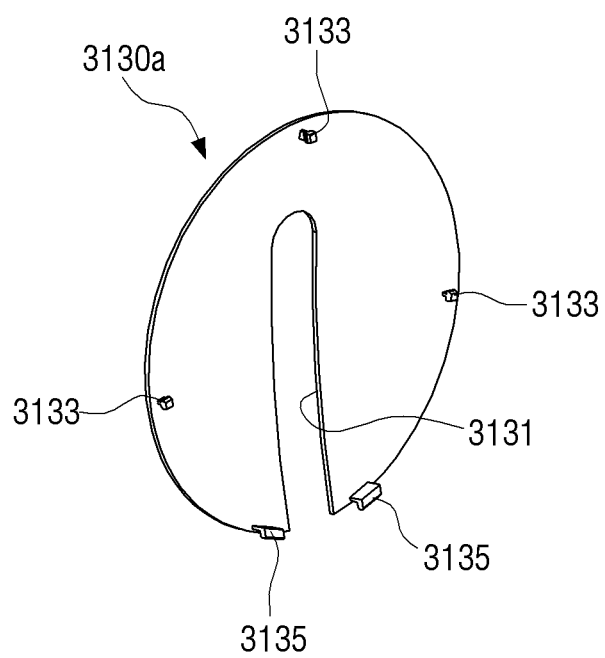
FIG. 28 is a perspective view illustrating a display body cover detachably coupled to the mounting groove shown in FIG. 27.

It is exemplified that the display body cover 3130 is combined with the mounting groove 3120 through the snap coupling structure, but the present disclosure is not limited thereto. As shown in FIGS. 27 and 28, one touch unlocking structure could be applied.

FIG. 27 is a perspective view illustrating an engagement structure where a display body cover is engaged with a mounting groove, and FIG. 28 is a perspective view illustrating a display body cover detachably coupled to the mounting groove shown in FIG. 27.

Referring to FIG. 27, a plurality of push latches 3360 may be disposed at the mounting groove 3210 formed on the rear surface 3111 of the display body with a predetermined interval.

Referring to FIG. 28, a plurality of locking protrusions 3133 locked to the respective push latches 3360 may be formed in the display body cover 3130A.

A process of combining the display body cover 3130A with the mounting groove 3210 is as below. The display body cover 3130A may rotate in the direction of the mounting groove 3120 on the basis of the plurality of locking protrusions 3135 while the plurality of locking protrusions 3135 are inserted into a plurality of engagement holes 3129 formed at a lower end of the mounting groove 3120.

Pushing the display body cover 3130a until it is in close contact with the mounting groove 3120 may allow a plurality of locking protrusions 3133 to be locked to the respective corresponding push latches 3360.

However, when the display body cover 3130A is detached from the mounting groove 3120, and the display body cover 3130A is pressed toward the front of the display body 3110, the plurality of locking protrusions 3133 may be unlocked from the respective push latches 3360.

According to the above described embodiments, a single stand mounting structure formed in the display body of a display apparatus may be compatible with the stand designed in various shapes and by organizing and concealing cables through the stand, the outside of the display apparatus may be kept simple.

In addition, according to the embodiments of the present disclosure, when a display body hangs on a wall by using a wall mount unit, a display body may be closely attached onto a wall as if a frame is hung on a wall. Therefore, the display apparatus may well go with the surrounding interior.

Although exemplary embodiments have been shown and described, it will be appreciated by those skilled in the art that changes may be made to these exemplary embodiments without departing from the principles and spirit of the present disclosure. Accordingly, the scope of the present disclosure is not construed as being limited to the described exemplary embodiments, but is defined by the appended claims as well as equivalents thereto.

What is claimed is:

1. A stand, comprising: a mounting member mountable on and detachable from a rear surface of a display apparatus, the mounting member including a plurality of locking protrusions detachably coupled to a plurality of locking holes formed on the rear surface of the display apparatus by being inserted into the plurality of locking holes; a support connected to the mounting member; and a base connected to a lower end of the support, the base including a guide groove through which a cable connected to the display apparatus passes; and wherein the guide groove is formed obliquely relative to the base to extend between a first opening disposed at a side of the base corresponding to a portion of the display apparatus from which the cable is drawn, and a second opening formed at a lower end of the base farther from the portion of the display apparatus from which the cable is drawn.

2. The stand as claimed in claim 1, wherein the base has a conical shape, through which the guide groove is formed.

3. The stand as claimed in claim 2, wherein the first opening is formed on a circumferential surface of the base, and
wherein the second opening is formed on a bottom of the base.

4. The stand as claimed in claim 2, wherein the support is rotatably coupled to an upper end of the base.

5. The stand as claimed in claim 1, further comprising a first cap and a second cap formed to fasten, to the base, the cable passed through the guide groove,
wherein the first cap and the second cap are formed to be coupled to and decoupled from the first opening and the second opening, respectively.

* * * * *